United States Patent [19]

Okikawa et al.

[11] Patent Number: 5,285,949
[45] Date of Patent: * Feb. 15, 1994

[54] WIRE-BONDING METHOD, WIRE-BONDING APPARATUS, AND SEMICONDUCTOR DEVICE PRODUCED BY THE WIRE-BONDING METHOD

[75] Inventors: Susumu Okikawa, Ohme; Michio Tanimoto, Kokubunji, both of Japan

[73] Assignee: Hitachi, Ltd., Tokyo, Japan

[*] Notice: The portion of the term of this patent subsequent to Oct. 6, 2009 has been disclaimed.

[21] Appl. No.: 907,034

[22] Filed: Jul. 1, 1992

Related U.S. Application Data

[62] Division of Ser. No. 619,504, Nov. 29, 1990, Pat. No. 5,152,450, which is a division of Ser. No. 149,081, Jan. 26, 1988, Pat. No. 4,998,002.

[30] Foreign Application Priority Data

Jan. 26, 1987 [JP] Japan .................................. 14035/87
Jun. 19, 1987 [JP] Japan ................................. 152839/87

[51] Int. Cl.⁵ ............................................. B23K 31/02
[52] U.S. Cl. ................... 228/179.1; 228/4.5; 228/205
[58] Field of Search .............. 228/179, 205, 4.5, 20, 228/110, 222; 29/850; 219/56.21, 56.22

[56] References Cited

U.S. PATENT DOCUMENTS

| | | | |
|---|---|---|---|
| 3,102,331 | 9/1963 | Costa | 228/4.5 |
| 3,789,183 | 1/1974 | Conley | 219/92 |
| 4,564,734 | 1/1986 | Okikawa | 219/56.22 |
| 4,572,772 | 2/1986 | Peterson | 219/56.22 |
| 4,580,713 | 4/1986 | Sekibata et al. | 228/111 |
| 4,674,671 | 6/1987 | Fister et al. | 228/111 |
| 4,705,204 | 11/1987 | Hirota et al. | 228/179 |
| 4,890,780 | 1/1990 | Mimata et al. | 228/4.5 |
| 4,925,083 | 5/1990 | Farassat et al. | 228/4.5 |

Primary Examiner—Paula A. Bradley
Assistant Examiner—Chuck Y. Mah
Attorney, Agent, or Firm—Antonelli, Terry, Stout & Kraus

[57] ABSTRACT

The present invention relates to a wire bonding method and a wire bonding apparatus employing a coated wire in which the surface of a metal wire is coated with an insulator, and a semiconductor device produced by the bonding method. The present invention includes forming a mixed gas of (1) a combustible gas and (2) a temperature controlling gas for lowering the combustion temperature of the mixture; and removing the insulator coating material from the coated wire at a bonding part of the coated wire, so as to denude the surface of a metal wire, by the use of flames produced by the combustion of the combustible gas of the mixed gas. The removal of the insulator is executed by an insulator removal torch. Also, the present invention includes forming a metal ball on the front end of a coated wire; joining the metal ball to an external terminal of a semiconductor chip; bringing the rear end of the coated wire into contact with an external lead and destroying the insulator coating where the coated wire contacts the lead; and joining the metal wire at the rear end of the coated wire to the lead. According to the above-stated expedients, the combustion flames, which do not impose any damage or breakdown on the metal wire, can be turned around substantially the whole area of the bonding part of the coated wire, so that the insulator of the coated wire can be readily removed to lessen bonding defects. Moreover, the melting and shrinking insulator of the coated wire is blown away, and insulator globes can be prevented from being formed in the coated wire, so that the bonding defects are avoidable.

32 Claims, 15 Drawing Sheets

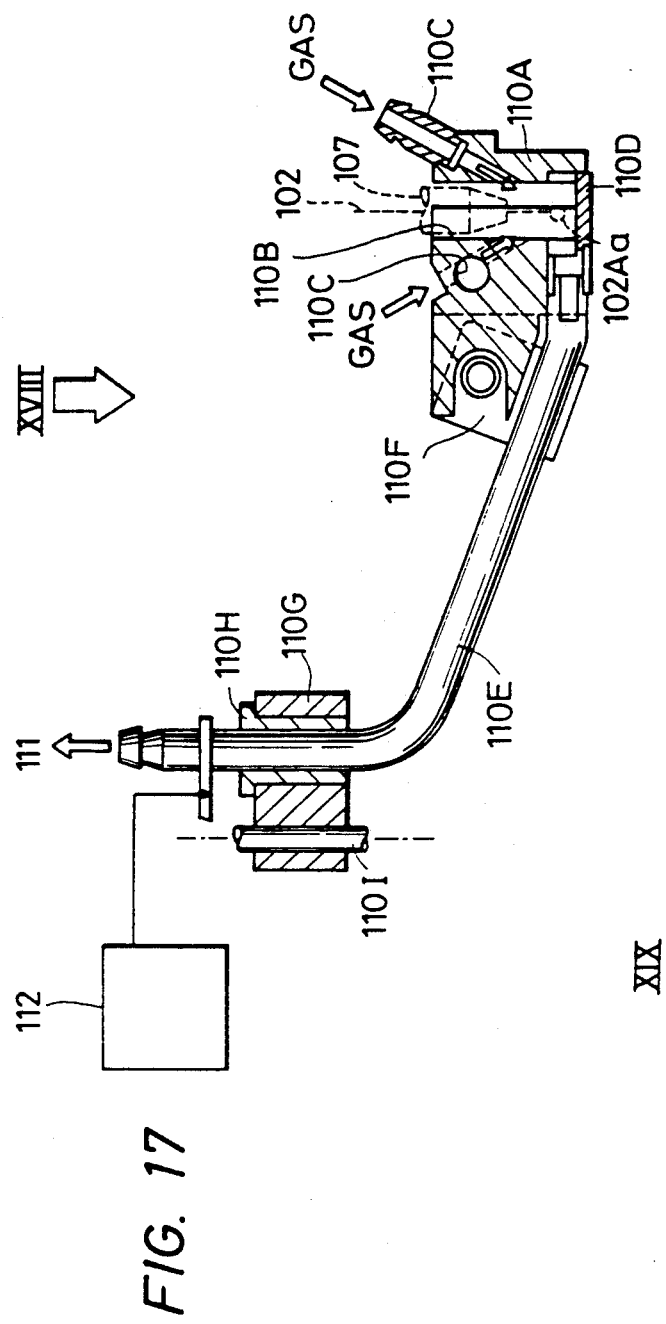
FIG. 17
FIG. 18
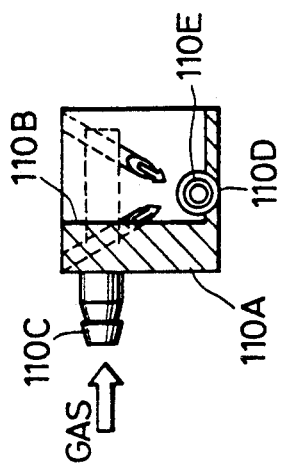
FIG. 19

WIRE-BONDING METHOD, WIRE-BONDING APPARATUS, AND SEMICONDUCTOR DEVICE PRODUCED BY THE WIRE-BONDING METHOD

This is a division of application Ser. No. 07/619,504 filed Nov. 29, 1990, now U.S. Pat. No. 5,152,450 which is a division of application Ser. No. 07/149,081 filed Jan. 26, 1988 U.S. Pat. No. 4,998,002.

BACKGROUND OF THE INVENTION

The present invention relates to a wire-bonding method, a wire-bonding apparatus, and a semiconductor device which is produced by the wire-bonding method. More particularly, it relates to techniques which are effective when applied to wire-bonding technology employing a coated wire having the surface of a metal wire coated with an insulator, as well as semiconductor devices employing the coated wire.

A wire is used for the connection between the semiconductor chip and lead of a resin-encapsulated semiconductor device. The wire is joined by a wire-bonding apparatus.

The wire is wound round a spool with which the bonding apparatus is furnished, and it is supplied from the spool to a bonding space through a tensioner, a wire clamper, a bonding tool, etc. The bonding apparatus is so constructed that the wire formed with a ball at the supply-side front end thereof is joined to the external terminal (bonding pad) of the semiconductor chip (pellet), whereupon the rear-end side of the wire of predetermined length is joined to the lead which is an external drawing-out lead formed in a lead frame. The bonding method of this type is called "ball bonding". The ball at the front end of the wire on the supply side thereof is formed by thermal energy generated in such a way that an electric torch (an arc electrode) is brought near to the supply-side front end of the wire so as to strike electric arcs.

As the wire, there is a tendency to use a coated wire. The coated wire is such that the surface of a metal wire of gold (Au), copper (Cu) or the like is coated with an electric insulator made of a resin material such as polyurethane resin or polyimide resin. This coated wire has the feature that, when the semiconductor device has been encapsulated with a resin for the purpose of packaging, a defective continuity ascribable to the contact between the individual wires, a defective continuity ascribable to the contact between the wire and the semiconductor chip, etc. can be prevented by the coating of the electric insulator.

In joining the coated wire to the wire-bonding part, namely, the external terminal of the semiconductor chip or the lead, the insulator of the coating at the part of the coated wire to be joined needs to be removed. The removal of the insulator is naturally intended to ensure the electrical connection and perfect continuity between the coated wire and the external terminal or lead.

A technique for removing the insulator of the coated wire is disclosed in the official gazette of Japanese Patent Application Laid-Open No. 194735/1986, the application of which was filed by the assignee of the present application. This technique consists in that the insulator of the bonding part of the coated wire is irradiated with a laser beam so as to be decomposed (melted) and removed.

SUMMARY OF THE INVENTION

As the result of the study of the above technique, however, the inventors have found out that the following problem is involved:

The coated wire is unidirectionally irradiated with the laser beam to remove the insulator. The insulator of the bonding part of the coated wire directly irradiated with the laser beam can be reliably removed. It is impossible, however, to remove the insulator of the bonding part of the coated wire in an area which corresponds to the rear of the coated wire and on which the laser beam is not projected. Therefore, the insulator of the bonding part of the coated wire is left behind, and a bonding defect arises.

An object of the present invention is to provide a technique capable of reducing bonding defects in bonding technology which uses a coated wire, and apparatus for performing such technique.

Another object of the present invention is to provide a technique capable of reliably removing the insulator at the bonding part of a coated wire in bonding technology which uses the coated wire.

Another object of the present invention is to provide a technique capable of reducing bonding defects and also preventing the electrostatic breakdown of a semiconductor device in bonding technology which uses a coated wire, apparatus for performing such technique and the semiconductor device formed.

Another object of the present invention is to provide a technique capable of mitigating the damages and breakdown of an insulator that is the coating of a coated wire to be supplied in bonding technology which uses the coated wire.

Another object of the present invention is to provide a technique capable of dispensing with an arc electrode and an arcing unit for forming the metal ball of a coated wire in bonding technology which uses the coated wire.

Another object of the present invention is to provide a technique capable of mitigating the damages and breakdown of an insulator and enhancing the reliability of bonding technology in the bonding technology which uses a coated wire.

Besides, another object of the present invention is to provide a technique capable of enlarging the number of terminals of a semiconductor device in semiconductor manufacturing technology which uses a coated wire.

Another object of the present invention is to provide a technique capable of accomplishing the preceding objects and also enhancing the bondability between the external terminal of the semiconductor chip of the semiconductor device and the coated wire in semiconductor manufacturing technology which uses the coated wire.

Another object of the present invention is to provide a technique capable of simplifying the structure of a bonding apparatus in semiconductor manufacturing technology which uses a coated wire.

Another object of the present invention is to provide a technique capable of preventing a bonding defect ascribable to the appearance of globules of the insulator of a coated wire in semiconductor manufacturing technology which uses the coated wire.

Another object of the present invention is to provide a technique capable of preventing a bonding defect ascribable to the shrinkable melting of the insulator of a coated wire and the scattering of the insulator in semiconductor manufacturing technology which uses the coated wire.

Another object of the present invention is to provide a technique capable of mitigating the shrinkable melting of a coated wire and preventing a bonding defect ascribable to the appearance of insulator globules in semiconductor manufacturing technology which uses the coated wire.

The aforementioned and other objects and novel features of the present invention will become apparent from the description of this specification and the accompanying drawings.

BRIEF DESCRIPTION OF THE DRAWINGS

Further.

FIG. 17 is a partial sectional view showing the practicable construction of the specific portions of the ball-bonding apparatus;

FIG. 18 is a plan view taken in the direction of arrow XVIII in FIG. 17;

FIG. 19 is a sectional view taken along cutting-plane line XIX—XIX in FIG. 18;

DESCRIPTION OF THE PREFERRED EMBODIMENTS

Figure 1:
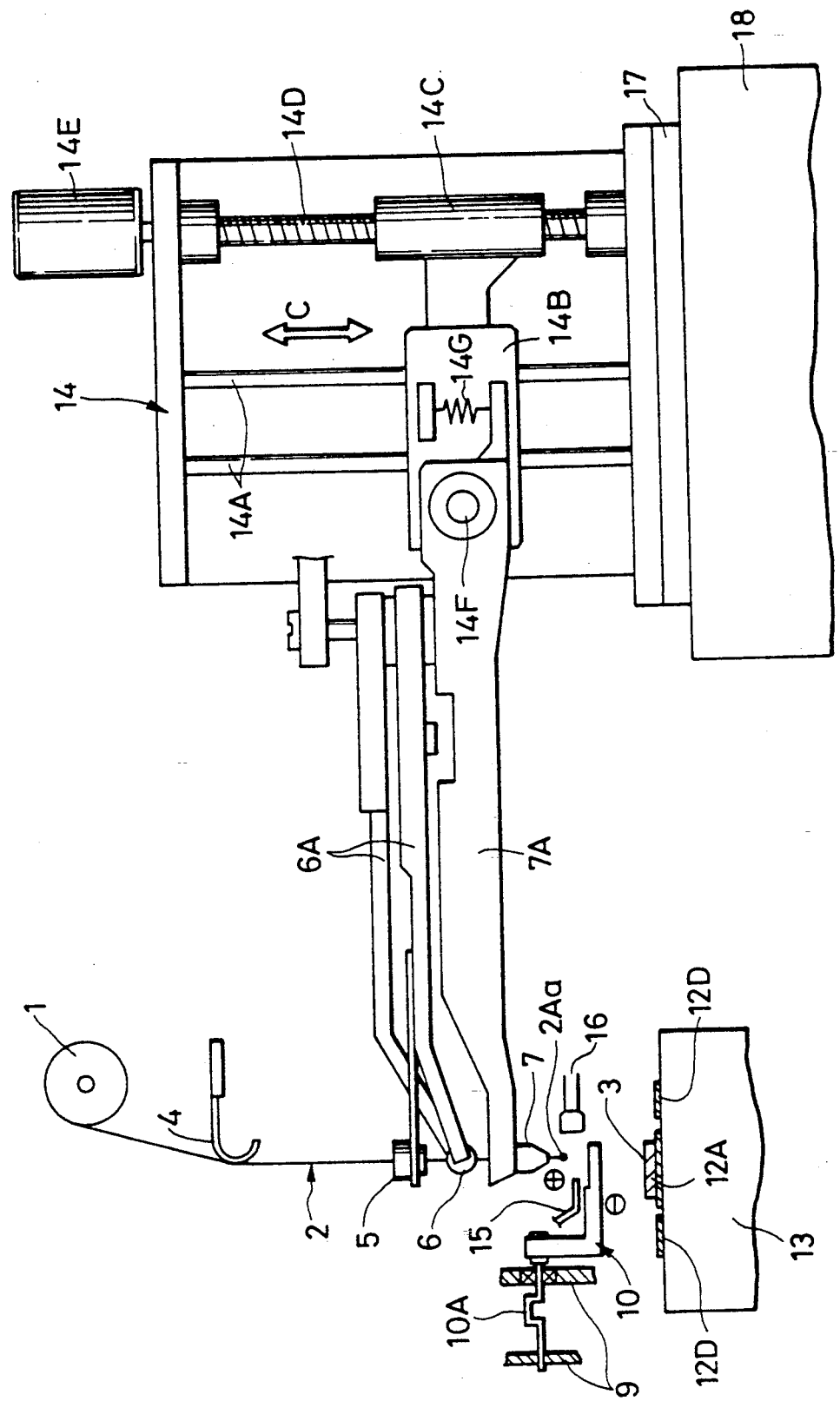
FIG. 1 is a schematic constructional view of a ball-bonding apparatus which is Embodiment 1 of the present invention.

Several embodiments to be disclosed in this section will be briefly summarized to assist understanding of the present invention.

The outlines of Embodiments 1 through 4 are as follows:

In bonding technology which uses a coated wire, a mixed gas consisting of a combustible gas and a temperature controlling gas for lowering the combustion temperature of the combustible gas is prepared, and using combustion flames obtained by burning the combustible gas of the mixed gas, an insulator in the bonding part of the coated wire is removed to denude the surface of a metal wire. The removal of the insulator is performed with an insulator removal torch.

In addition, the metal wire of the coated wire from which the insulator has been removed is formed into a metal ball by use of the combustion flames stated above or combustion flames formed by burning another mixed gas.

Besides, a heater is provided hear the blowoff outlet of the insulator removal torch for the combustible gas.

Besides, the dimensions of the blowoff outlet of the insulator removal torch for the combustible gas are made small.

Further, in bonding technology wherein electric arcs are struck across an arc electrode and the metal wire of a coated wire at the front end thereof, so as to form a metal ball at the front end of the coated wire, the metal wire of the coated wire is connected to a positive electrode, and the arc electrode is connected to a negative electrode.

According to the above-stated expedients, combustion flames which do not impose any damage or breakdown on the metal wire can be turned around substantially the whole area of the bonding part of the coated wire, so that the insulator of the coated wire can be reliably removed to lessen bonding defects.

In addition, since the metal ball of the coated wire is formed by the combustion flames, an arc electrode and an arcing unit can be dispensed with.

Besides, the combustion flames of the combustible gas can be reliably formed at the blowoff outlet of the insulator removal torch for the combustible gas, so that the insulator of the coated wire can be reliably removed to lessen bonding defects.

Besides, the heat capacity of the combustion flames burning at the blowoff outlet of the insulator removal torch for the combustible gas can be made small, so that the insulator of the coated wire which is supplied near the flames can be prevented from being damaged or be prevented from breaking down.

Further, the position of the electric arcs which are struck across the arc electrode and the metal wire of the coated wire is stabilized, and damage or breakdown of the insulator of the coated wire attributed to the upward crawl of the electric arcs can be prevented, so that the withstand voltage of the coated wire can be raised to enhance the reliability of the bonding technology.

On the other hand, the outlines of Embodiments 5 and 6 are as follows:

In a semiconductor device which uses a coated wire, a metal ball formed at one end side of the coated wire is joined to the external terminal of a semiconductor chip, and a metal wire on the other end side of the coated wire in a contact part where an insulator has been destroyed is joined to a lead.

In addition, in bonding technology which uses a coated wire, a metal ball is formed on the front end side of the coated wire, the metal ball is joined to the external terminal of a semiconductor chip, the rear end side of the coated wire is brought into contact with a lead, an insulator in the contact part is destroyed, and a metal wire on the other end side of the coated wire is joined to the lead.

In bonding technology wherein a metal ball is formed at the front end of a coated wire, a fluid blast equipment for blasting a fluid against the front end part of the coated wire is disposed near the front end of the coated wire.

In the bonding technology wherein a metal ball is formed at the front end of a coated wire, the fluid blast equipment stated above is disposed, and a suction equipment for imbibing that insulator of the coated wire which is blown away by the blast of the fluid from the fluid blast equipment is disposed near the front end of the coated wire.

In the bonding technology wherein a metal ball is formed at the front end of a coated wire, the fluid blast equipment stated above is disposed, and a cooler for cooling the fluid of the fluid blast equipment is disposed.

According to the above-stated expedients, the area of contact between the external terminal of the semiconductor chip and the metal wire of the coated wire increases, so that the bondability between the two can be enhanced, and the coated wire except the part to be joined with the lead is held coated with the insulator so as to mitigate the short-circuit of this coated wire with another coated wire adjacent thereto, so that the intervals of the leads can be shortened to enlarge the number of the terminals of the semiconductor device.

In addition, an insulator removal torch which removes the insulator of the coated wire on the rear end side thereof, and a moving mechanism, a controller, etc., for the torch can be curtailed, so that the structure of a bonding apparatus can be simplified.

Besides, the melting and shrinking insulator of the coated wire is blown away, and insulator globes can be prevented from being formed in the coated wire, so that a bonding defect is avoidable.

Besides, since the melting and shrinking insulator of the coated wire can be blown away to prevent insulator globes from being formed in the coated wire, a bonding defect is avoidable, and since the insulator blown away is not scattered to the bonding part, a bonding defect ascribable to the scattered insulator is avoidable.

Besides, the shrinkable melting of the insulator of the coated wire is remarkably reduced, and even when the insulator has melted and shrunk, it can be blown away, so that insulator globes can be prevented from being formed in the coated wire, and a bonding defect can be avoided.

Embodiment 1

Figure 2:
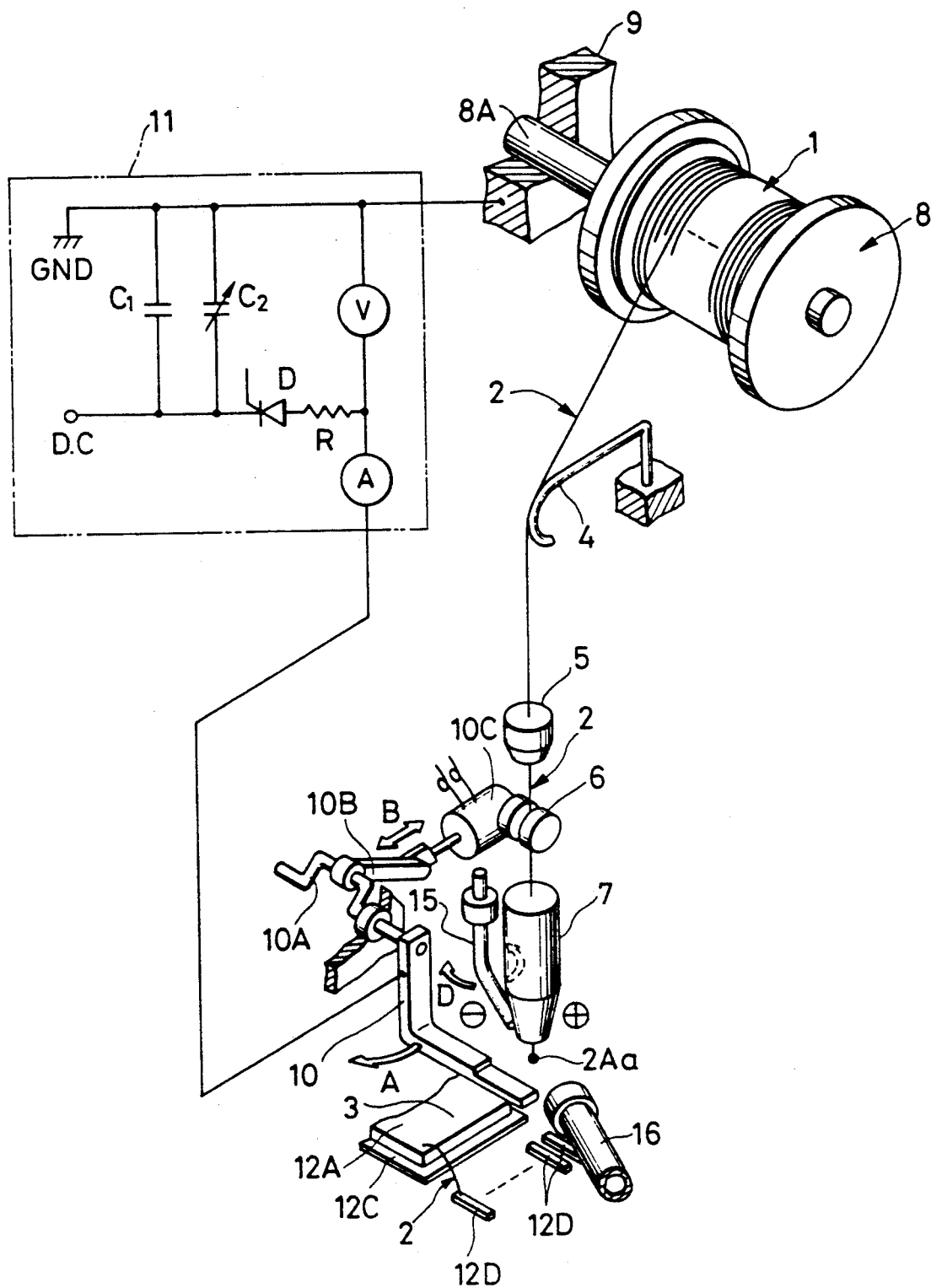
FIG. 2 is a perspective view of specific portions of the bonding apparatus.

A ball-bonding apparatus which is Embodiment 1 of the present invention is illustrated in FIG. 1 (a schematic constructional view) and FIG. 2 (a perspective view of specific portions).

As shown in FIG. 1, the bonding apparatus is so constructed that a coated wire 2 wound around a spool 1 is supplied to a bonding space 3. The supply of the coated wire 2 to the bonding space 3 is performed through a tensioner 4, a wire guide member 5, a wire chamber 6 and a bonding tool (capillary) 7.

Figure 3:
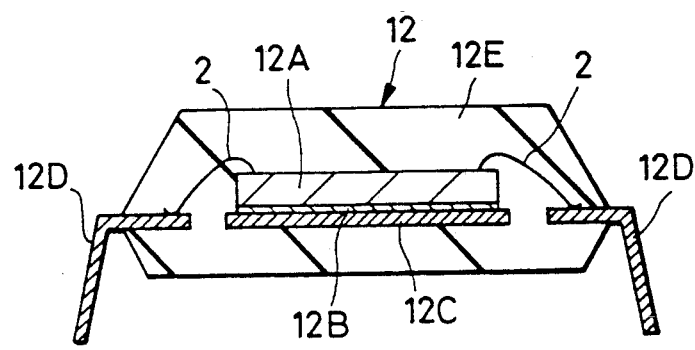
FIG. 3 is a sectional view of a resin-encapsulated semiconductor device which has been bonded by the bonding apparatus.
Figure 4:
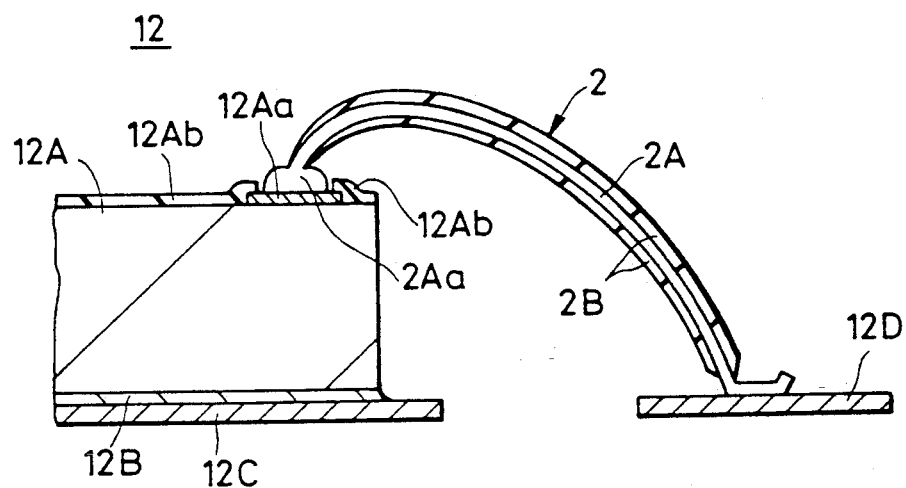
FIG. 4 is a sectional view of specific portions of the resin-encapsulated semiconductor device.

In the bonding space 3, a resin-encapsulated type semiconductor device 12 before resin encapsulation to be constructed as shown in FIG. 3 (a sectional view) and FIG. 4 (a sectional view of important portions) is arranged. The resin-encapsulated semiconductor device 12 is so constructed that a semiconductor chip 12A placed on a tab portion 12C through a connecting metal film 12B and the inner lead parts of leads 12D are encapsulated by a resin mold member 12E. The semiconductor chip 12A and the lead 12D are connected by the coated wire 2. One end of the coated wire 2 is joined to an external terminal (bonding pad) 12Aa which is exposed through an opening provided in the passivation film 12Ab of the semiconductor chip 12A. The other end of the coated wire 2 is joined to the inner lead part of the lead 12D as stated before. The outer lead part of the lead 12D is formed so as to protrude outside the resin mold member 12E. The resin-encapsulated type semiconductor device 12 before the resin encapsulation step is supported on a semiconductor device bed 13.

As shown in detail in FIG. 4, the coated wire 2 is so constructed that the surface of a metal wire 2A is coated with an insulator 2B. The metal wire 2A is made of gold (Au) in the present embodiment. Alternatively, the metal wire 2A is made of copper (Cu), aluminum (Al) or the like. The insulator 2B is formed of a polyurethane resin film or a polyimide resin film in the present embodiment. Alternatively, the insulator 2B is formed of a resin film such as ester imide resin film or ester amide resin film, or a metal oxide film (of CuO, $Cu_2O$ or $Al_2O_3$).

Figure 5:
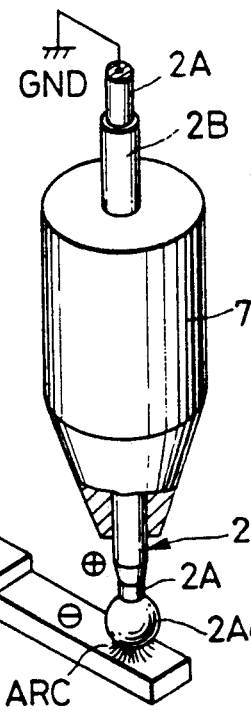
FIG. 5 is an enlarged perspective view of specific portions of the bonding apparatus.

The front end of the coated wire 2 on the supply side thereof, which lies in front of the bonding tool 7, is formed with a metal ball 2Aa. As shown in FIG. 1, FIG. 2 and FIG. 5 (an enlarged perspective view of important portions), the metal ball 2Aa is formed by an arc electrode 10 which is disposed at a position close to the bonding tool 7. That is, the metal ball 2Aa is formed by striking electric arcs across the metal wire 2A at the supply-side front end of the coated wire 2 and the arc electrode 10. The arc electrode 10 is connected to an arcing circuit (or arcing unit) 11 shown in FIG. 2.

The arcing circuit 11 is principally constructed of a capacitor $C_1$, a storage capacitor $C_2$, an arcing thyristor D which is actuated by a trigger, and a resistor R. A d.c. power source DC is arranged so as to feed a voltage of negative polarity at, for example, approximately $-1000 - -3000$ V. The d.c. power source DC is connected to the arc electrode 10 through the thyristor D, the resistor R, etc. A reference potential GND is, for example, the ground potential (=0 V). Letter V indicates a voltmeter, and letter A an ammeter. As will be described in detail later, the metal wire 2A of the coated wire 2 is connected to the reference potential GND at its end part wound around the spool 1.

The arc electrode 10 is adapted to come near to the supply-side front end of the coated wire 2 when the metal ball 2A*a* is to be formed, and to move away from the supply path of the coated wire 2 (in the direction of arrow A indicated in FIG. 2) during the bonding step. The movement of the arc electrode 10 is carried out by a first moving mechanism which is constructed of a crank 10A for turning the arc electrode 10 in the direction of the arrow A, a shaft 10B for rotating the crank 10A, and an electric solenoid 10C for shifting the shaft 10B in the direction of arrow B. The crank 10A is rotatably supported by a bonding apparatus proper 9.

In the bonding apparatus wherein, in this manner, the electric arcs are struck across the metal wire 2A at the front end of the coated wire 2 and the arc electrode 10 so as to form the metal ball 2A*a* at the front end of the coated wire 2, the metal wire 2A of the coated wire 2 is connected to a positive electrode (+), and the arc electrode 10 is connected to a negative electrode (−), whereby the position of the electric arcs struck across the metal wire 2A of the coated wire 2 and the arc electrode 10 can be stabilized more than in the case of the polarity being reversed (that is, where the coated wire 2 is connected to a negative electrode (−) and the arc electrode 10 is connected to a positive (+) electrode), and hence, the upward crawl of the electric arcs to the metal wire 2A of the coated wire 2 can be relieved. The relief of the upward crawl of the electric arcs prevents damage or breakdown of the insulator 2B of the coated wire 2 and can raise the withstand voltage of the coated wire 2, so that the reliability of the bonding technology can be enhanced.

In the present invention, the metal wire 2A of the coated wire 2 can be connected to a voltage higher or lower than the reference potential GND so as to have a plus potential with respect to the arc electrode 10.

Figure 6:
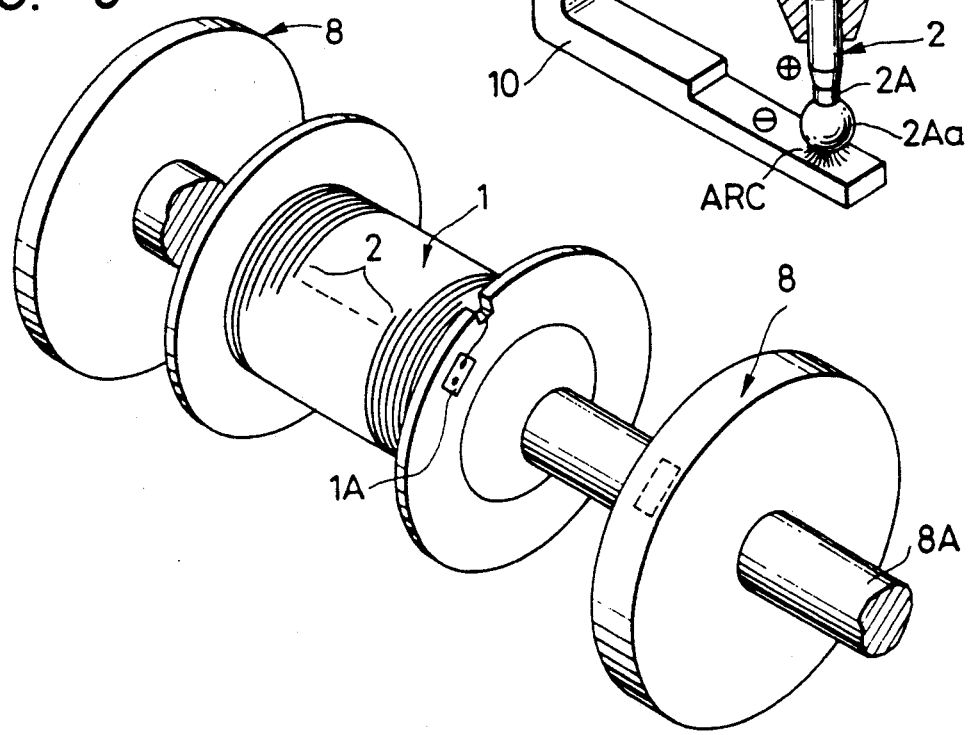
FIG. 6 is an exploded perspective view of specific portions of the bonding apparatus.

The spool 1 around which the coated wire 2 is wound is constructed as illustrated in FIG. 2 and FIG. 6 (an exploded perspective view of specific portions). By way of example, the spool 1 is fabricated by subjecting the surface of a cylindrical member of aluminum metal to an alumite treatment (a conventional treatment). The alumite treatment is performed in order to raise the mechanical strength and to prevent flaws from developing. This spool 1 has an insulating property because it has been subjected to the alumite treatment as stated above.

The spool 1 is mounted on a spool holder 8, and is attached to the bonding apparatus proper 9 by the rotary shaft 8A of the spool holder 8.

The spool holder 8 is made of, for example, stainless steel in order to have a conductivity in at least a part thereof.

Figure 7:
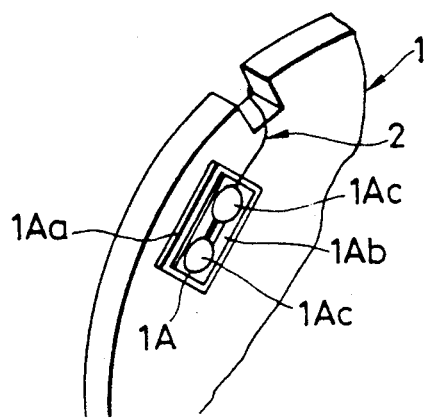
FIG. 7 is an enlarged perspective view of specific portions of the bonding apparatus.

In the bonding apparatus thus constructed, the spool 1 is provided with a connection terminal 1A as shown in FIG. 6 and FIG. 7 (an enlarged perspective view of specific portions). The connection terminal 1A is provided in the shape of a dot on that side face part (flange part) of the spool 1 which comes into contact with the conductive part of the spool holder 8.

As shown in FIG. 7, the connection terminal 1A is so configured that a conductor 1A*b* is disposed on an insulator 1A*a* and that connecting metal portions 1A*c* are disposed on the conductor 1A*b*. The insulator 1A*a* is made of, for example, polyimide resin so as to exhibit a proper elasticity which ensures the electrical isolation of the connection terminal 1A from the spool 1 and also ensures contact of the connecting metal portions 1A*c* to the spool holder 8. The conductor 1A*b* is made of, for example, Cu foil so as to ensure the connection between the one of the connecting metal portions 1A*c* which connects the metal wire 2A of the coated wire 2 and the other 1A*c* which comes into contact with the spool holder 8. The connecting metal portions 1A*c* are made of a conductive paste, a solder or the like.

The metal wire 2A at the end of the coated wire 2 on the opposite end to the end which is supplied to the bonding space 3, that is, the metal wire 2A at the initial winding end of the coated wire 2, is connected to the connection terminal 1A through a notch which is formed in the side face (flange part) of the spool 1. This metal wire 2A is joined to the connection terminal 1A by the connecting metal portion 1A*c*. The insulator 2B on the surface of the metal wire 2A at the initial winding end of the coated wire 2 is removed chemically or by heating. The connection terminal 1A, namely, the metal wire 2A of the coated wire 2 is connected to the reference potential GND through the spool holder 8, the rotary shaft 8A thereof and the apparatus proper 9. This reference potential GND is the same as the reference potential GND of the arcing circuit 11.

In this manner, the spool 1 is furnished with the connection terminal 1A for connecting the metal wire 2A to the reference potential GND, and the metal wire 2A at the initial winding end of the coated wire 2 is joined to this connection terminal, whereby the metal wire 2A can be connected to the reference potential GND through the spool holder 8, etc., so that the metal wire 2A of the coated wire 2 can be reliably connected to the reference potential GND.

Besides, owing to the connection of the metal wire 2A of the coated wire 2 to the reference potential GND, during the formation of the metal ball 2A*a* a sufficient potential difference is secured between the arc electrode 10 and the metal wire 2A of the coated wire 2 on the supply side, and the electric arcs can be favorably struck, so that the metal ball 2A*a* can be reliably formed.

Moreover, owing to the connection of the metal wire 2A of the coated wire 2 to the reference potential GND, the stray capacitance of the metal wire 2A of the coated wire 2 can be prevented from being charged up. That is, at the step of first bonding at which the metal ball 2A at the supply-side front end of the coated wire 2 is joined to the external terminal 12A*a* of the semiconductor chip 12A, charges stored due to stray capacitance can be prevented from flowing into the input/output stage circuit of the semiconductor chip 12A in the form of an excess voltage. Therefore, electrostatic breakdown of the semiconductor chip is avoidable.

As illustrated in FIGS. 1 and 2, the bonding tool 7 is carried by a bonding head (digital bonding head) 14 through a bonding arm 7A. The bonding head 14 is supported on a base 18 through an X-Y table 17. By movement of the X-Y table 17, the bonding tool can be moved so as to bond the wire to an external terminal of the semiconductor chip and to the corresponding inner lead part of a lead. The bonding head 14 is furnished with a second moving mechanism which can move the bonding arm 7A vertically (in the direction of double-headed arrow C) so as to permit the bonding tool 7 to come close to and away from the bonding space 3. The second moving mechanism is principally constructed of a guide member 14A, an arm moving member 14B, a female screw member 14C, a male screw member 14D and a motor 14E. The guide member 14A is so configured as to move the arm moving member 14B in the direction of the arrow C. The motor 14E rotates the male screw member 14D, the female screw member 14C in fit engagement with the male screw member 14D is moved in the direction of the arrow C by the rotation, and the arm moving member 14B is shifted in the direction of the arrow C by the movement.

The bonding arm 7A supported by the arm moving member 14B is adapted to turn about a swivel shaft 14F. The turning of the bonding arm 7A about the swivel shaft 14F is controlled by an elastic member 14G. The control of the turning by the elastic member 14G is so provided that, when the bonding tool 7 has touched the bonding space 3, this bonding space 3 is prevented from being unnecessarily pressed, whereby damage or breakdown of the bonding space 3 is avoided.

The wire clamper 6 can clamp the coated wire 2, and is constructed so as to control the supply of the coated wire 2. The wire clamper 6 is mounted on the bonding arm 7A through clamper arms 6A.

The wire guide member 5 is so constructed that the coated wire 2 supplied from the spool 1 is guided to the bonding space 3. This wire guide member 5 is mounted on the clamper arm 6A.

Figure 8:
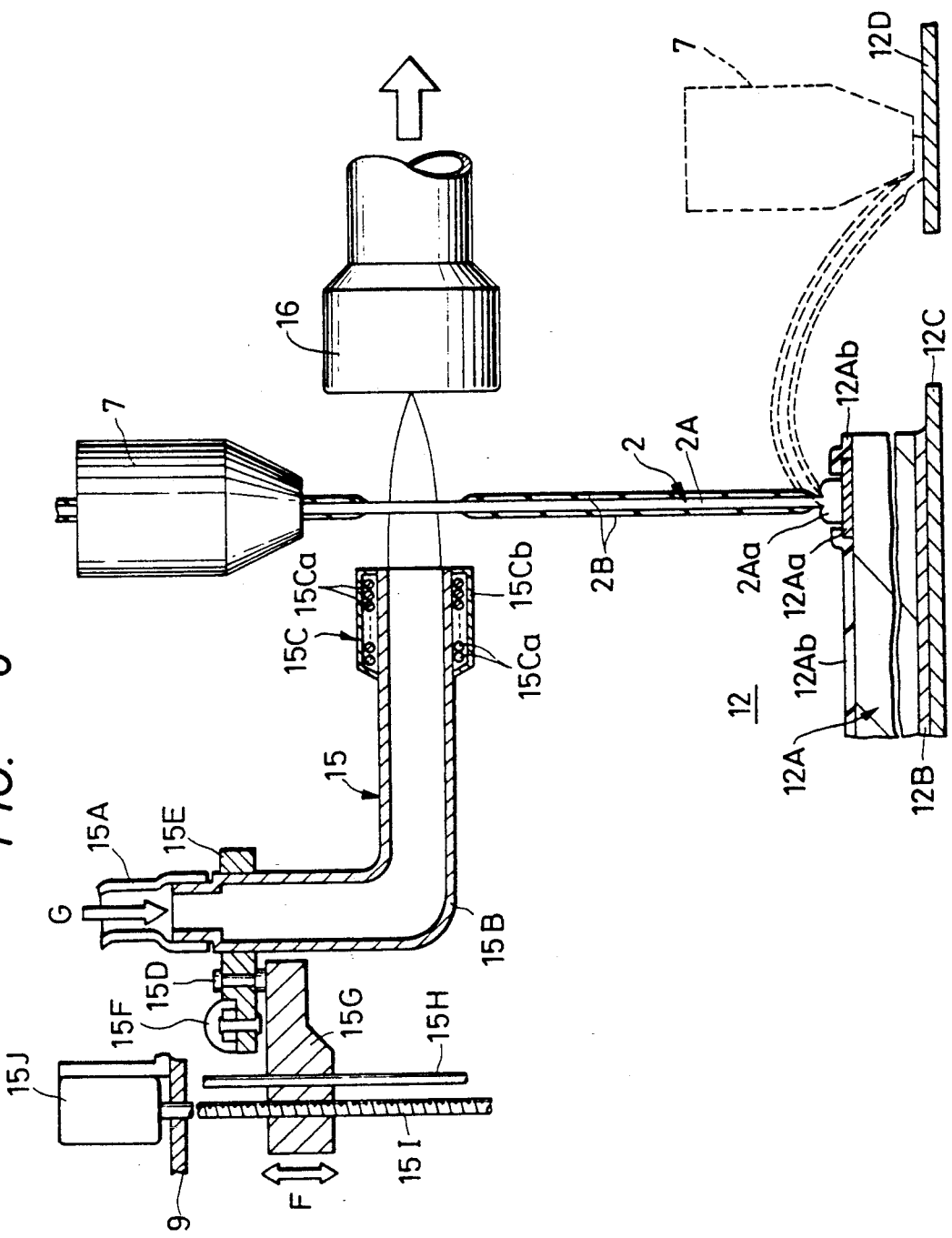
FIG. 8 is a sectional view of specific portions of the bonding apparatus.
Figure 9:
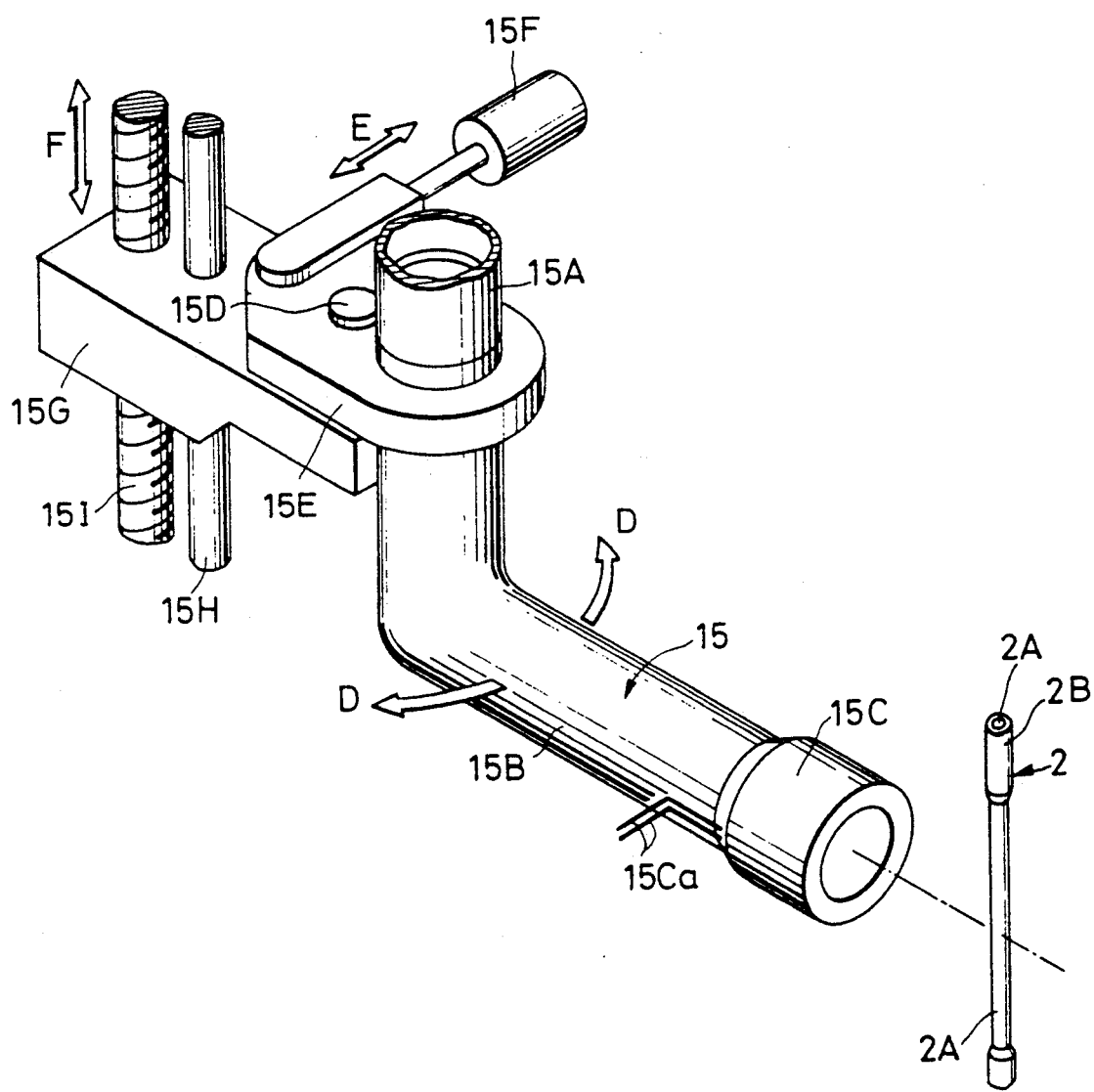
FIG. 9 is a perspective view of specific portions of the bonding apparatus.

As illustrated in FIG. 1, FIG. 2, FIG. 8 (a sectional view of specific portions) and FIG. 9 (a perspective view of specific portions), an insulator removal torch 15 is disposed near the supply path of the coated wire 2. Concretely, the insulator removal torch 15 is disposed near the supply path of the coated wire 2 between the bonding space 3 and the bonding tool 7.

The insulator removal torch 15 is constructed of a torch proper 15B in the shape of a cylinder which is supplied with a mixed gas G by a mixed-gas supply pipe 15A as shown in FIG. 8, and a heater 15C which is provided near a blowoff outlet for the mixed gas. The torch proper 15B is made of, for example, ceramics, brass or the like. The heater 15C is composed of a heating wire 15Ca which is wound on the torch proper 15B, and a thermal insulator 15Cb which covers the heating wire. This heater 15C is configured so as to heat the mixed gas G (a combustible gas to be described below, contained therein) in order that burning flames may be always blown off from the outlet of the insulator removal torch 15 (a spontaneous firing state in which burning flames do not go out may be kept).

By providing the heater 15C near the blowoff outlet of the insulator removal torch 15 for the combustible gas in this manner, the combustible gas can be reliably burnt, so that the insulator 2B of the coated wire 2 can be readily decomposed and removed.

The mixed gas G to flow through the torch proper 15B is prepared by mixing the combustible gas and a temperature controlling gas which lowers the combustion temperature of this combustible gas. As the combustible gas, hydrogen ($H_2$) is used in the present embodiment. As the temperature controlling gas, nitrogen ($N_2$) is used in the present embodiment. The burning flames of the combustible gas made up of hydrogen are at a low temperature of about 1300° C., and are formed into a comparatively round shape at the blowoff outlet of the insulator removal torch 15. Such a relatively round shape for the burning flames can be achieved by using a much greater amount of nitrogen than of hydrogen, in the mixed gas of nitrogen and hydrogen. The temperature controlling gas made up of nitrogen can control (lower) the burning flames of the combustible gas to a low temperature of about 1000° C. Further, the temperature controlling gas can control the burning flames of the combustible gas into a sharp shape. Thus, the shape of the burning flames can be controlled by choosing relative amounts of the temperature controlling gas and the combustible gas (e.g., nitrogen and hydrogen, respectively). By using much greater amounts of nitrogen than of hydrogen, in the mixture, the shape of the flame is rounder, as stated previously; as the amount of hydrogen, relative to the amount of the nitrogen, in the mixing gas, increases, the shape of the burning flame becomes sharper (more conical, as shown in FIG. 8). As seen in the foregoing, by controlling the relative amounts of, e.g., nitrogen and hydrogen (for example, by controlling the amount of nitrogen while maintaining the amount of hydrogen), the burning flame shape can be controlled; such relative amounts of hydrogen and nitrogen is the main controlling factor of the flame shape. A further factor in controlling the flame shape is the flow speed of the mixed gas, which can also be controlled by controlling the flow of the temperature controlling gas. In order to efficiently lower the temperature of the burning flames, the temperature controlling gas should preferably be supplied into the insulator removal torch 15 in a comparatively cold state.

Alternatively, the insulator removal torch 15 may be supplied with only the combustible gas (for example, $H_2$) without the feed of the temperature controlling gas.

In this manner, the insulator removal torch 15 is configured so as to blow off the burning flames of the combustible gas from the outlet thereof while controlling the combustion temperature of the combustible gas of the mixed gas G by the use of the temperature controlling gas. As illustrated in FIGS. 8 and 9, the burning flames from the blowoff outlet of the insulator removal torch 15 are adapted to decompose and remove the insulator 2B of the coated wire 2. They are sharply blown off in a direction which is substantially orthogonal to the supply path of the coated wire 2. The insulator 2B decomposed and removed is imbibed and expelled by a suction duct 16 which is disposed at a position confronting the blowoff outlet of the insulator removal torch 15 with the coated wire 2 intervening therebetween.

The insulator removal torch 15 is attached to a third moving mechanism which traverses the supply path of the coated wire 2 in the direction of arrows D (refer to FIG. 9). The third moving mechanism is constructed of a rotary member 15E which turns the torch proper 15B about a pin 15D, and a pressure solenoid 15F which turns the rotary member 15E in the direction of double-headed arrow E. This third moving mechanism is configured so that the coated wire 2 may be traversed at a predetermined speed and that the burning flames from the outlet of the insulator removal torch 15 may be blown against the side of the insulator 2B confronting the outlet and the rear side thereof. Thus, as shown in FIG. 8, the burning flames extend so as to envelope (that is, extend beyond) the coated wire 2, whereby the burning flames contact the rear side of the coated wire 2. The third moving mechanism is configured so that the burning flames from the insulator removal torch 15 may turn to the rear side of the insulator 2B of the coated wire 2 more reliably. The operation of the insulator removal torch 15 based on the third moving mechanism is set so that the coated wire 2 may be traversed one or more times.

As illustrated in FIGS. 8 and 9, the third moving mechanism is attached to a fourth moving mechanism which moves the third one in the direction of double-headed arrow F (substantially the same direction as the supply direction of the coated wire 2). The fourth moving mechanism is principally constructed of a movable bed 15G, a guide member 15H, a male screw member 15I, and a motor 15J. The movable bed 15G has the third moving mechanism (the insulator removal torch 15) mounted thereon, and is adapted to move in the direction of double-headed arrow F along the guide member 15H. The movement of the movable bed 15G is executed in such a way that a female screw portion (not shown) formed in this bed is held in fit engagement with the male screw member 15I and that the male screw member 15I is rotated by the motor 15J.

The fourth moving mechanism is configured so as to set the insulator removal torch 15 at the bonding part of the coated wire 2. That is, the fourth moving mechanism is configured so as to set the insulator removal torch 15 to the vicinity of that position of the coated wire 2 which corresponds to the bonding part to be joined with the inner lead part of the lead 12D and the bonding part to be joined with the external terminal 12Aa of the semiconductor chip 12A at the bonding step next after that of the first-mentioned bonding part. The insulator removal torch 15 which can be positioned as described herein is adapted to remove the insulator 2B of both the bonding end parts of the coated wire 2 in a single step by the use of the burning flames.

Figure 10:
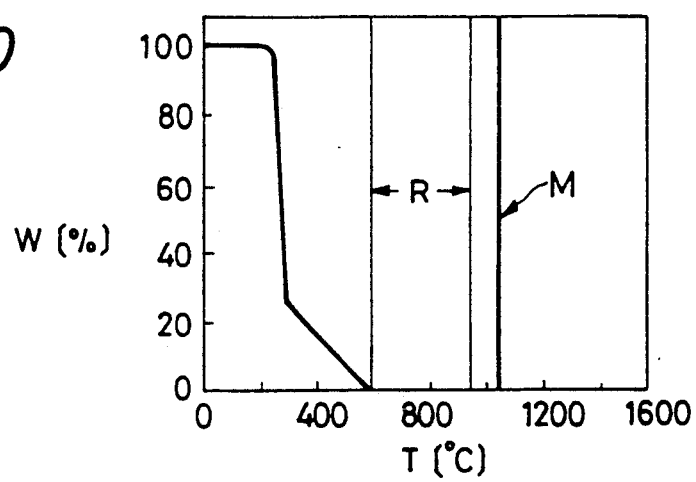
FIGS. 10 and 11 are graphs each showing the relationship between the melting point of the metal wire and the decomposition temperature of a coated wire which is used in the bonding apparatus.
Figure 11:
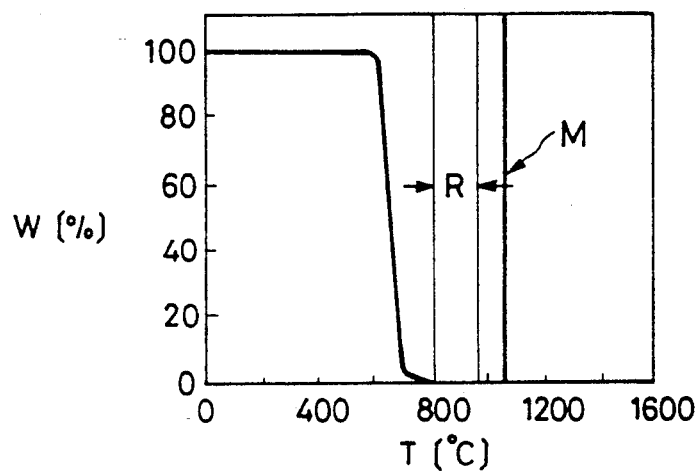

As indicated in FIGS. 10 and 11 (graphs each showing the relationship between the melting point of the metal wire of the coated wire and the decomposition temperature of the insulator thereof), the insulator removal torch 15 constructed as stated above can reliably remove the insulator 2B without damaging the metal wire 2A of the coated wire 2. Experimental results in FIGS. 10 and 11 were obtained by differential thermal analyses.

FIG. 10 is the graph showing the relationship between the melting point M of the metal wire 2A made of gold (Au) and the decomposition temperature of the insulator 2B made of polyurethane resin. The axis of abscissas represents the temperature T [° C.], while the axis of ordinates represents the decomposition residue weight W [%] of the insulator 2B. As shown in FIG. 10, the decomposition (or liquefying) and removal of the insulator 2B of the coated wire 2 is most suitably carried out within a range of temperatures which are nearly equal to, but lower than, the melting point of the metal wire 2A and at which the insulator 2B can be reliably decomposed (or liquefied) and removed, in other words, within a range of temperatures of approximately 600°-950° C. which form a temperature range denoted by letter R in FIG. 10. Since the burning flames from the blowoff outlet of the insulator removal torch 15 is controlled to a low temperature of approximately 1000° C. as stated before, the insulator 2B of the coated wire 2 can be decomposed (or liquefied) and removed under the optimum condition.

By way of example, Table 1 to be mentioned later lists various conditions in the case of using a coated wire 2 whose metal wire 2A has a diameter of 30 μm.

On the other hand, FIG. 11 is the graph showing the relationship between the melting point M of the metal wire 2A made of gold (Au) and the decomposition temperature of the insulator 2B made of polyimide resin. As shown in FIG. 11, the decomposition and removal of the insulator 2B of the coated wire 2 is most suitably carried out within a range of temperatures of approximately 800°-950° C.

Figure 12:
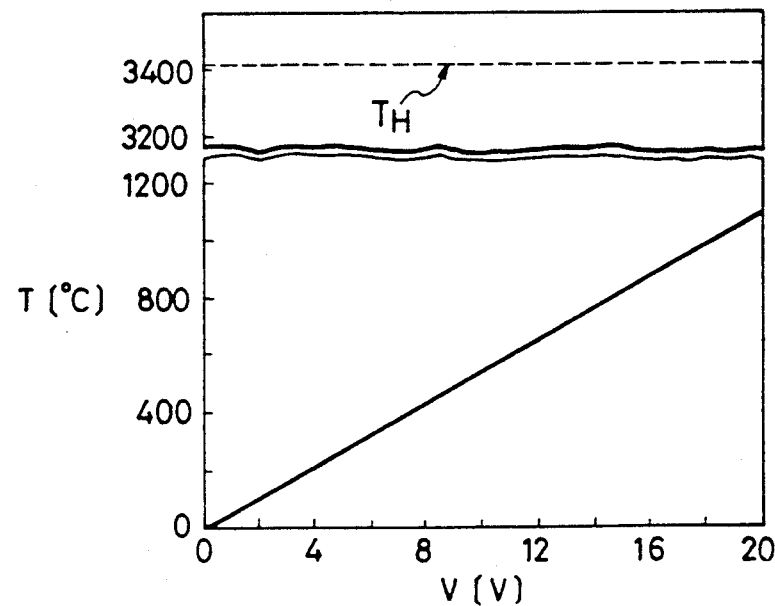
FIG. 12 is a graph showing the relationship between the applied voltage of the heating wire of a heater and the temperature of burning flames blown off from an outlet in the insulator removal torch of the bonding apparatus.

Meanwhile, as illustrated in FIG. 12 (a graph showing the relationship between a voltage V applied to the heating wire of the heater and the temperature T of the burning flames blown off from the outlet), the insulator removal torch 15 is so constructed that the temperature T of the burning flames to be blown off from the outlet can be controlled by the applied voltage V of the heating wire 15Ca of the heater 15. The heating wire 15Ca acts to heat (warm up) the combustible gas, e.g., without acting to ignite (fire up) the combustible gas. In FIG. 12, the axis of abscissas represents the voltage V [V] applied to the heating wire 15Ca, while the axis of ordinates represents the temperature T of the burning flames. For reference, the temperature $T_H$ of the flames of oxyhydrogen (the temperature of the burning flames of a mixed gas consisting of hydrogen gas and oxygen gas) is indicated in FIG. 12. This oxyhydrogen gas was a mixed gas of hydrogen gas and oxygen gas, gained by electrolysis of water; accordingly, the proportions (volume percent) of hydrogen gas and oxygen gas in the oxyhydrogen gas was 2:1. The oxyhydrogen flames are at a high temperature of approximately 3400° C., so that when they are used for the removal of the insulator 2B of the coated wire 2, the metal wire 2A as well as the insulator 2B is melted and damaged.

Next, the ball-bonding method of the present embodiment will be briefly described.

First, as shown in FIG. 5, the arc electrode 10 is brought near to that supply-side front end part of the coated wire 2 from which the insulator 2B has been removed to denude the surface of the metal wire 2A beforehand, and the electric arcs are struck to form the metal ball 2Aa.

Secondly, the bonding tool 7 is brought near to the bonding space 3, and the metal ball 2Aa is bonded to the external terminal 12Aa of the semiconductor chip 12A (first bonding).

Subsequently, the bonding tool 7 is raised in the direction of the arrow C up to an appropriate position so as to come away from the external terminal 12Aa.

Subsequently, the insulator removal torch 15 is set at the position near the bonding part (second bonding) of the coated wire 2. Then, the burning flames which are blown off from the outlet of the insulator removal torch 15 at all times traverse the coated wire 2, thereby to decompose and remove the insulator 2 of the bonding part of the coated wire 2 and to denude the surface of the metal wire 2A as illustrated in FIGS. 8 and 9.

In this manner, the mixed gas consisting of the combustible gas and the temperature controlling gas is prepared, and the combustion flames obtained by burning the combustible gas of the mixed gas are used for removing the insulator 2B of the bonding part of the coated wire 2 and denuding the surface of the metal wire 2A, whereby the combustion flames (which do not damage or cause any breakdown of the metal wire 2A) can be turned around substantially the whole area of the bonding part of the coated wire 2, and hence the insulator 2B of the coated wire 2 can be reliably removed. That is, the removal of the insulator 2B of the coated wire 2 by the burning flames of lower temperature has the feature of causing no damage of the metal wire 2A when compared with the removal thereof by the oxyhydrogen flames, and it has the feature of being capable of reliably removing the insulator on the basis of the movement (turning-round) of the burning flames when compared with the removal thereof by the laser beam.

At the next step, the bonding tool 7 is lowered to the position from which the insulator 2B has been removed to denude the metal wire 2A. As illustrated by phantom lines in FIG. 8, the bonding tool 7 is brought near to the inner lead part, whereby the other end of the coated wire 2 at which the metal wire 2A is denuded is bonded to the inner lead part (the second bonding).

Subsequently, the bonding tool 7 is brought away, and the coated wire 2 is cut, whereby the bonding process is completed as shown in FIG. 4.

Since the insulator 2B of the coated wire 2 can be reliably removed in the foregoing way, the metal wire 2A of the coated wire 2 and the bonding space 3 (the external terminal 12A$a$ or the inner lead part) can be reliably joined, and bonding defects can be lessened.

Incidentally, although Embodiment 1 has bonded the coated wire 2 and the bonding space 3 by the use of the ball-bonding technology, the present invention can bond them by the use of ultrasonic bonding technology.

Besides, the present invention can use carbon dioxide ($CO_2$) as the combustible gas of the mixed gas and can use argon (Ar) or helium (He) as the temperature controlling gas.

Besides, the present invention is applicable to the wire bonding techniques of a ceramic-encapsulated semiconductor device, an electron device in which a plurality of semiconductor chips are packaged on a wiring circuit board, etc.

Besides, the present invention may be so constructed that the combustible gas is caused to flow through the torch proper 15B of the insulator removal torch 15 and is burnt at the blowoff outlet, while the temperature controlling gas is blown off near the outlet.

Further, as the wire bonding system, the present invention can adopt a thermocompression system and/or an ultrasonic vibration system under the optimum conditions for the specifications of the coated wire and the device to be subjected to the wire bonding.

Embodiment 2

Embodiment 2 is another embodiment of the present invention which alters the configuration of the arc electrode for forming the metal ball in the bonding apparatus of Embodiment 1.

Though not shown in the drawings, the bonding apparatus which is Embodiment 2 of the present invention is so constructed that, in forming the metal ball 2A$a$ at the front end of the coated wire 2 by means of the arc electrode 10 shown in FIG. 5, this metal ball 2A$a$ is shielded from an outer (non-controlled) atmosphere by an inert gas.

The inert gas is blasted from a shield-gas supply nozzle for supplying it, the nozzle being disposed near the interspace between the arc electrode 10 and the metal wire 2A at the front end of the coated wire 2. Alternatively, the arc electrode 10 may be provided with a cylindrical member into which the metal wire 2A at the front end of the coated wire 2 can be inserted, whereupon the inert gas is blasted into the cylindrical member. As the inert gas, argon (Ar) or helium (He) is used.

In this manner, in forming the metal ball 2A$a$, the surrounding region thereof is shielded from a non-controlled atmosphere by the inert gas, whereby in the case of making the insulator 2B of the coated wire 2 out of a resin, the melting and rising or shrinking of the insulator 2B is mitigated, and the chemical reaction thereof with the non-controlled atmosphere can be prevented, so that the metal ball 2A$a$ can be formed to be favorable. Especially in the case of making the metal wire 2A of the coated wire 2 out of copper (Cu), the chemical reaction thereof with components of a non-controlled atmosphere can be prevented, and the formation of an oxide film on the surface of the metal ball 2A$a$ can be avoided.

Embodiment 3

Embodiment 3 is another embodiment of the present invention in which, in the bonding apparatus, the metal ball is formed by a combustion torch.

This Embodiment 3 is so constructed that, in the ball-bonding technology, the metal ball 2A$a$ at the front end of the coated wire 2 is formed by the insulator removal torch 15 for removing the insulator 2B as stated before. In other words, the setup of the arc electrode 10 and the arcing circuit 11 can be dispensed with.

Apart from the insulator removal torch 15, an oxyhydrogen flame torch may be disposed as the torch for forming the metal ball 2A$a$.

More specifically, a bonding process proceeds as follows:

First, using the burning flames of the insulator removal torch 15 or the oxyhydrogen flame torch, the metal ball 2A$a$ is formed at the supply-side front end of the coated wire 2.

Secondly, the first bonding is carried out.

Subsequently, using the burning flames of the insulator removal torch 15, the insulator 2B at the bonding parts of the coated wire 2 (the second bonding part, and the first bonding part at the next step) is removed to denude the surface of the metal wire 2A.

Subsequently, the second bonding is carried out.

Next, likewise to the foregoing, the metal ball 2A$a$ is formed at the supply-side front end of the coated wire 2 by the use of the burning flames of the insulator removal torch 15 or the oxyhydrogen flame torch. In the case of forming the metal ball 2A$a$ by means of the insulator removal torch 15, when the melting point of the metal wire 2A of the coated wire 2 is not reached, the mixing ratio of the gaseous mixture is changed, and/or the moving speed of the burning flames to traverse the coated wire 2 is controlled.

In this manner, the metal wire 2A of the coated wire 2 from which the insulator 2B has been removed is formed into the metal ball 2A$a$ by the use of the burning flames mentioned above or burning flames formed by the combustion of any other mixed gas, whereby the metal ball 2A$a$ of the coated wire 2 is formed by the burning flames, so that the arc electrode 10 and the arcing circuit 11 described in Embodiments 1 and 2 are unnecessary.

Embodiment 4

Embodiment 4 is another embodiment of the present invention which alters the configuration of the insulator removal torch in the bonding apparatus.

Though not shown in the drawings, Embodiment 4 is so constructed that the heater 15C of the insulator removal torch 15 described in each of Embodiments 1, 2 and 3 is removed and that the size (diameter) of the blowoff outlet of the insulator removal torch 15 for the combustible gas is made smaller than the bore of the torch proper 15B. With the insulator removal torch 15 thus constructed, the heat capacity of the burning flames of the combustible gas to be blown off from the outlet can be decreased. Illustratively, the blowoff outlet has a bore size of 35–150 μm in diameter. Preferably, the size of the blowoff outlet is set within a range from a minimum value of 75 μm, based on a machining limit, to the maximum value of 125 μm, for the decrease of the heat capacity of the burning flames.

Since the insulator removal torch 15 thus constructed has a smaller heat capacity, it can use the combustible gas (for example, $H_2$) only, the combustible gas and the temperature controlling gas (for example, $N_2$) for lowering the temperature of the burning flames of the combustible gas, or a temperature controlling gas (for example, a slight amount of $O_2$) for raising the temperature of the burning flames of the combustible gas. By way of example, Table 2 to be mentioned later lists various conditions for removing the insulator 2B of the coated wire 2.

In this manner, the heat capacity of the burning flames at the blowoff outlet of the combustible gas can be decreased by making the size of the outlet of the insulator removal torch 1 smaller, so that the transfer of heat to the bonding tool 7 located near the insulator removal torch 15 is diminished, and the insulator 2B of the coated wire 2 to be supplied can be prevented from damaging or breaking down.

Although, in the above, the invention made by the inventors has been concretely described in conjunction with the embodiments, it is a matter of course that the present invention is not restricted to the foregoing embodiments, but that it can be variously modified within a scope not departing from the purport thereof.

TABLE 1

| 1 | Length of Burning Flames | 7 mm |
|---|---|---|
| 2 | Combustible Gas $H_2$ | 0.82 lit./min. |
| 3 | Temperature Controlling Gas $N_2$ | 0.15 lit./min. |
| 4 | Bore of Torch Proper | 0.5 mm |
| 5 | Velocity of Flow of Mixed Gas | 85 m/sec. |
| 6 | Temperature of Blowoff Outlet | 1050° C. |
| 7 | Temperature of Burning Flames at a Position 4 mm Distant from Outlet | 850° C. |
| 8 | Resistance of Heating Wire | 4.5 Ω |
| 9 | Voltage Applied to Heating Wire | 20 V |
| 10 | Time in Which Coated Wire is Traversed | 0.01–0.05 sec. |

TABLE 2

| 1 | Length of Burning Flames | 3.5 mm |
|---|---|---|
| 2 | Combustible Gas $H_2$ | 0.01–0.15 lit./min. |
| 3 | Bore of Torch Proper | 0.5 mm |
| 4 | Diameter of Blowoff Outlet | 35–150 μm |
| 5 | Velocity of Flow of Mixed Gas | 200–300 m/sec. |
| 6 | Temperature of Blowoff Outlet | 1300° C. |
| 7 | Temperature of Burning Flames at a Position 4 mm Distant from Outlet | 1300° C. |
| 8 | Time in Which Coated Wire is Traversed | 0.01–0.05 sec. |

Embodiment 5

As described above, the technique disclosed in Embodiments 1–4 is effective as the technique for removing the insulator of the coated wire. This technique consists in that the burning flames from the insulator removal torch are blown against the bonding part of the coated wire, thereby to remove the insulator at the part. The burning flames are formed by the mixed gas which consists of hydrogen gas for combustion and temperature-controlling nitrogen gas for lowering the combustion temperature of the hydrogen gas. The insulator removal torch is so constructed that the insulator on the rear end of the coated wire to be joined with the lead and the insulator on the front end of the coated wire (bonding part) to be joined with the external terminal at the next step are removed at a time. This insulator removal torch is moved to the bonding part (the part where the insulator is to be removed) of the coated wire by the moving mechanisms and the controllers. The removal of the insulator of the coated wire employing this technique does not damage the metal wire of the coated wire, and can turn the burning flames around the whole area of the bonding part to completely remove the insulator. Therefore, it has the feature that a bonding defect (inferior continuity) attributed to incomplete removal of the insulator can be prevented.

The inventors, however, have found out that the following problems are involved in the technique stated above:

As described before, the removal of the insulator of the coated wire is executed by the insulator removal torch. This insulator removal torch is moved near to the bonding parts of the coated wire corresponding to the distance between the external terminals of the semiconductor chip and the leads, at the respective bonding steps. In consequence, not only the construction of the insulator removal torch, but also that of the bonding apparatus, becomes somewhat complicated because moving mechanisms for the torch and controllers for controlling the moving mechanisms in a complicated manner are necessary.

In addition, the ball at the supply-side front end of the coated wire is formed by bringing an arc electrode near to the front end and striking electric arcs across the metal wire and the arc electrode. After being formed, the ball on the front end side of the coated wire is joined to the external terminal of the semiconductor chip. In this regard, it has been acknowledged by the inventors that, due to heat attendant upon the generation of the electric arcs in forming the ball on the front end side of the coated wire, the insulator melts and rises or shrinks from the front end toward the rear end of the coated wire. The shrinkable melting of the insulator forms insulator globes (the bulk of the insulator) as part of the coating of the coated wire. The insulator globes grow to be larger than the diameter of the hole of the bonding tool for guiding the coated wire. Consequently, in a case where the ball is drawn toward the pressing face of the bonding tool after the formation thereof on the front end of the coated wire, a catch develops between the coated wire and the guide hole of the bonding tool. For this reason, the subsequent step of joining the ball to the external terminal of the semiconductor chip by means of applying pressure by the pressing face of the bonding tool becomes impossible, and a bonding defect arises.

Embodiment 5 to be detailed in this section solves the problems explained above.

Now, this embodiment will be described in detail.

Figure 13:
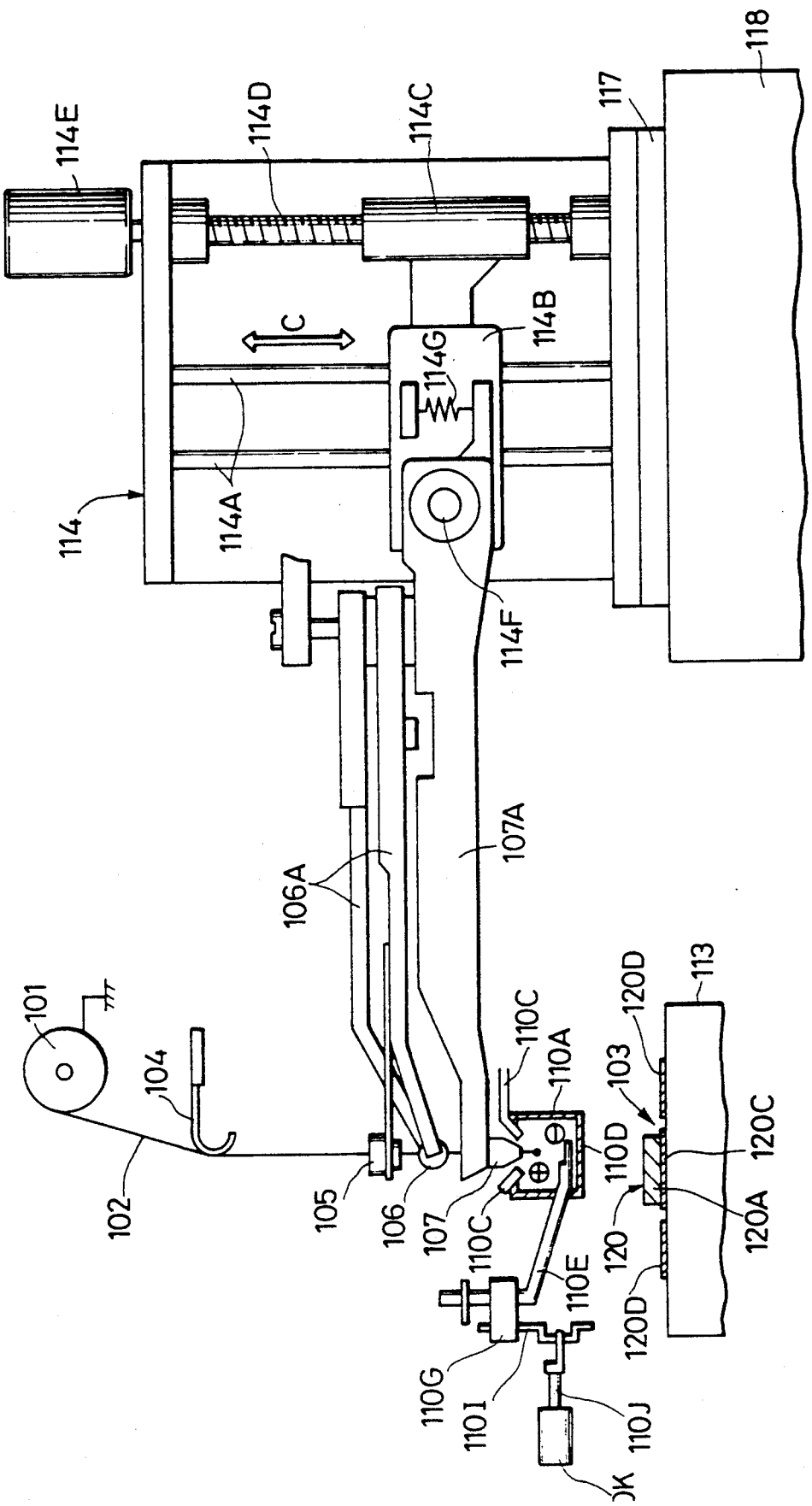
FIG. 13 is a schematic constructional view of a ball-bonding apparatus which is Embodiment 5 of the present invention.
Figure 14:
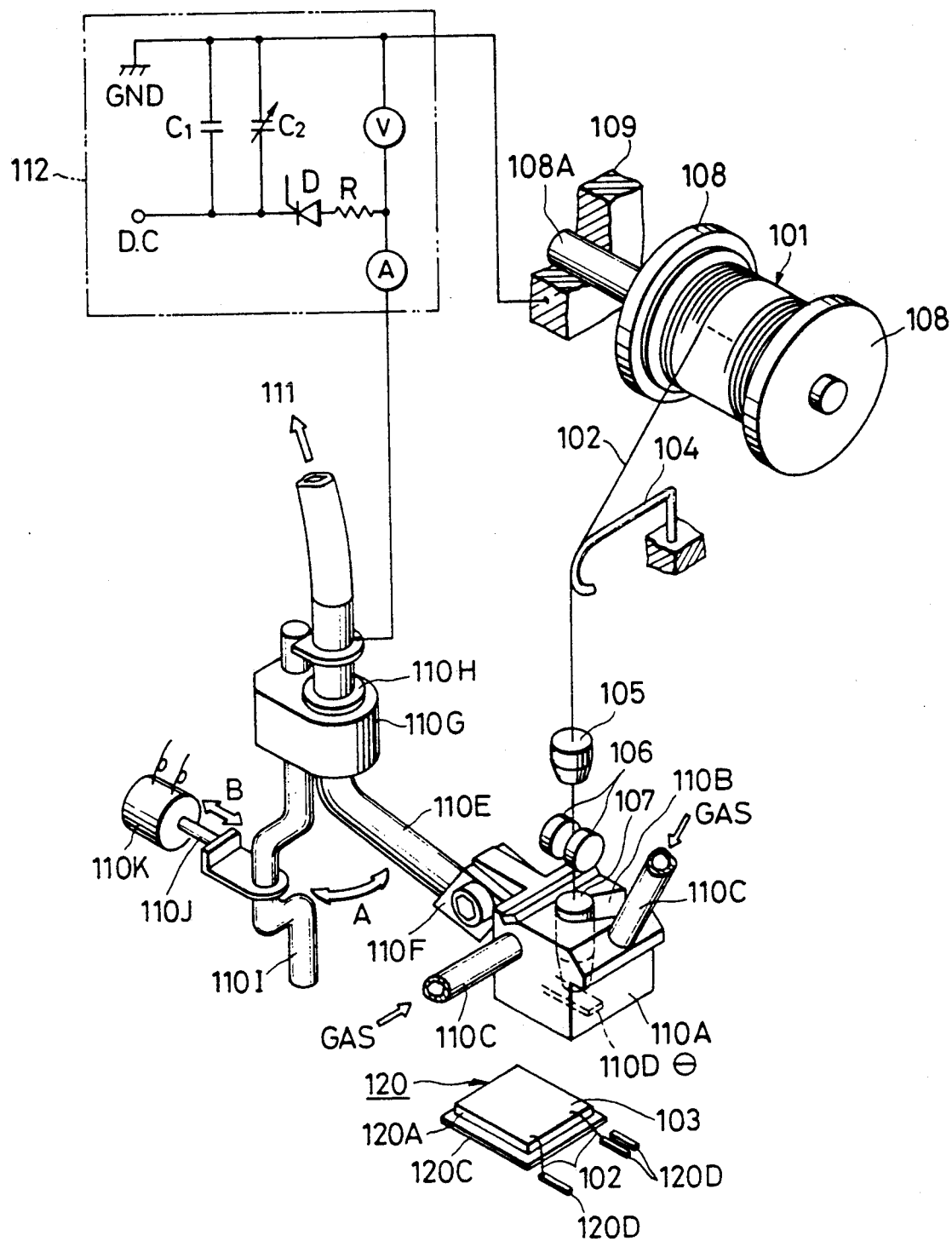
FIG. 14 is a perspective view of specific portions of the ball-bonding apparatus.

A ball-bonding (wire bonding) apparatus which is Embodiment 5 of the present invention is illustrated as a schematic constructional view in FIG. 13 and as a perspective view of specific portions in FIG. 14.

As shown in FIG. 13, the ball-bonding apparatus is so constructed that a coated wire 102 wound round a spool 101 is supplied to a bonding space 103. The supply of the coated wire 102 to the bonding space 103 is performed through a tensioner 104, a wire guide member 105, a wire clamper 106 and a bonding tool (capillary) 107.

Figure 15:
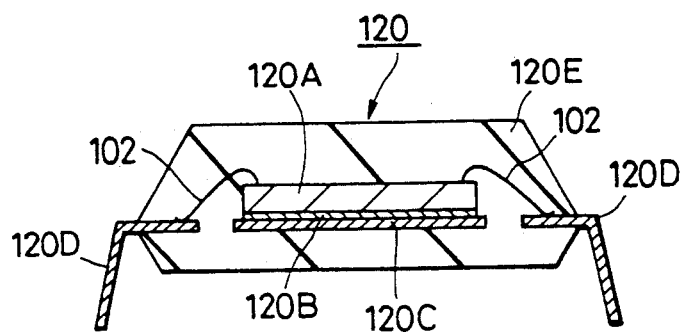
FIG. 15 is a sectional view of a resin-encapsulated semiconductor device.
Figure 16:
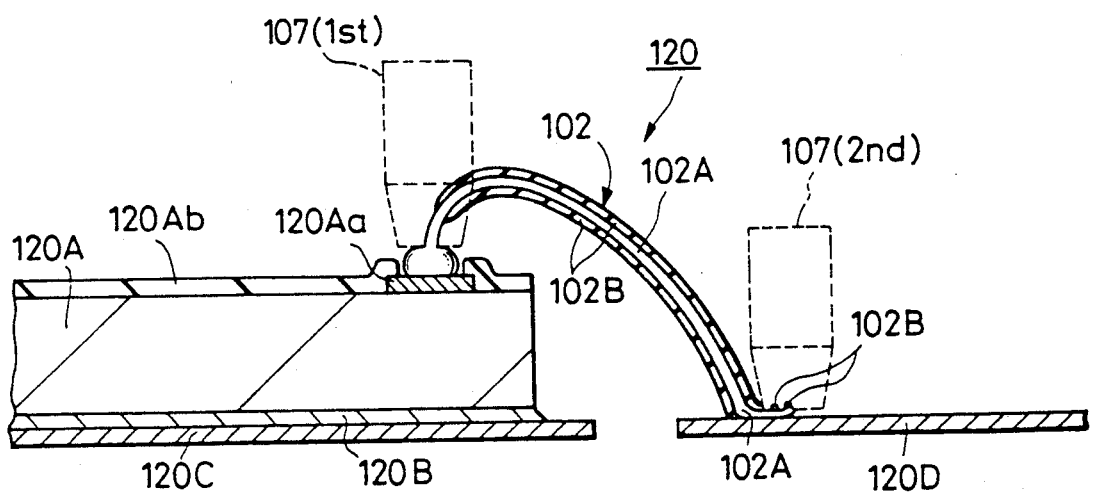
FIG. 16 is an enlarged sectional view of specific portions of the resin-encapsulated semiconductor device.

In the bonding space 103, a resin-encapsulated type semiconductor device 120 before resin encapsulation, the resin-encapsulated device being shown in FIG. 15 (a sectional view) and FIG. 16 (an enlarged sectional view of essential portions), is arranged. The resin-encapsulated semiconductor device 120 is so constructed that a semiconductor chip 120A placed on a tab portion 120C through a connecting metal film 120B and the inner lead parts of leads 120D are encapsulated by a resin mold member 120E. The semiconductor chip 120A and the lead 120D are connected by the coated wire 102. As shown in FIG. 16 one end of the coated wire 102 is joined to an external terminal (bonding pad) 120A$a$ which is exposed through an opening provided in the passivation film 120A$b$ of the semiconductor chip 120A. The other end of the coated wire 102 is joined to the inner lead part of the lead 120D. The outer lead part of the lead 120D is formed so as to protrude outside the resin mold member 120E. The resin-encapsulated type semiconductor device 120, before the resin encapsulation step, is supported on the semiconductor device bed (table for setting the semiconductor device) 113 of the bonding apparatus as depicted in FIG. 13.

As its structure is shown in detail in FIG. 16, the coated wire 102 is so constructed that the surface of a metal wire 102A is coated with an insulator 102B. the metal wire 102A is made of gold (Au) in the present embodiment. Alternatively, the metal wire 102A is made of copper (Cu), aluminum (Al) or the like. The insulator 102B is formed of a polyurethane resin film or a polyimide resin film in the present embodiment. Alternatively, the insulator 102B is formed of a resin film such as ester imide resin film or ester amide resin film, or a metal oxide film (of $CuO$, $Cu_2O$ or $Al_2O_3$).

Joined to the external terminal 120A$a$ of the semiconductor chip 120A is a metal ball 102A$a$ which is formed of the metal wire 102A denuded by removing the insulator 102B on one end of the coated wire 102. The metal ball 102A$a$ is configured with a diameter which is, for example, about 2-3 times as large as the diameter of the metal wire 102A. Joined to the inner lead part of the lead 120D is the metal wire 102A on the other end of the coated wire 102 as denuded by destroying the insulator 102B on the other end of the coated wire 102. That is, on the other end of the coated wire 102, only the insulator 102B corresponding substantially to the joint part with the lead 120D is removed, and the insulator 102B in the other part is left behind. As will be described later, the destruction of the insulator 102B on the other end of the coated wire 102 can be effected by ultrasonic vibrations, appropriate pressure application and appropriate heating (energy) which are afforded by the bonding tool 107.

In this manner, in the resin-encapsulated semiconductor device 120 which uses the coated wire 102, the metal ball 102A$a$ is formed of the metal wire 102A on one end of the coated wire 102 is joined to the external terminal 120A$a$ of the semiconductor chip 120A, and the metal wire 102A on the other end of the coated wire 102 with the insulator 102B of the contact part destroyed is joined to the lead 120D, whereby the external terminal 120A$a$ of the semiconductor chip 120A and the metal wire 102A of the coated wire 102 have their contact area increased owing to the ball-bonding system employing the metal ball 102A$a$ larger in size, in comparison with a contact area in a system connecting a bonding wire through ultrasonic vibrations, and the bondability between the two can be enhanced. Simultaneously, the other end of the coated wire 102 (except the part to be joined with the lead 120D) is kept coated with the insulator 102B, and the short-circuiting between the other end of this piece of coated wire 102 and that of another adjacent piece of coated wire 102 can be mitigated, so that the intervals of the leads 120D can be decreased to achieve an increase in the maximum number of terminals (pins) of the resin-encapsulated semiconductor device 120.

As illustrated in FIGS. 13 and 14, the bonding tool 107 and the front end part of the coated wire 102 in the supply direction thereof (the part where the metal ball 102A$a$ is to be formed) are arranged so as to be concealed by a cover member 110A when the metal ball 102A$a$ is to be formed. The cover member 110A is constructed so as to move and turn in the direction of double-headed arrow A indicated in FIG. 14. That is, the cover member 110A is so constructed that, at the step of forming the metal ball 102A$a$, the bonding tool 107 is inserted thereinto through a tool insertion port 110B by the turning motion in the direction of the arrow A and is covered therewith. This cover member 110A is configured as shown in FIG. 17 (a partial sectional view showing a concrete construction, and corresponding to a section taken along cutting-plane line XVII—XVII in FIG. 18), FIG. 18 (a plan view seen in the direction of arrow XVIII in FIG. 17) and FIG. 19 (a sectional view taken along cutting-plane line XIX—XIX in FIG. 18). As will be stated later, the cover member 110A is so set up that, at the step of forming the metal ball 102A$a$, the insulator 102B does not scatter to the bonding space 103 due to the blowing-away of the insulator 102B which melts and rises or shrinks. Besides, the cover member 110A is set up so as to facilitate the retention of a cover gas atmosphere (a shield gas atmosphere) for the prevention of oxidation in a case where the metal wire 102A of the coated wire 102 is made of a material that is easily oxidized, such as Cu or Al. The cover member 110A is made of, for example, stainless steel. Alternatively, the cover member 110A may be made of a transparent glass material so as to permit an operator to acknowledge the state of the formation of the metal ball 102A$a$ of the coated wire 102, etc.

Figure 20:
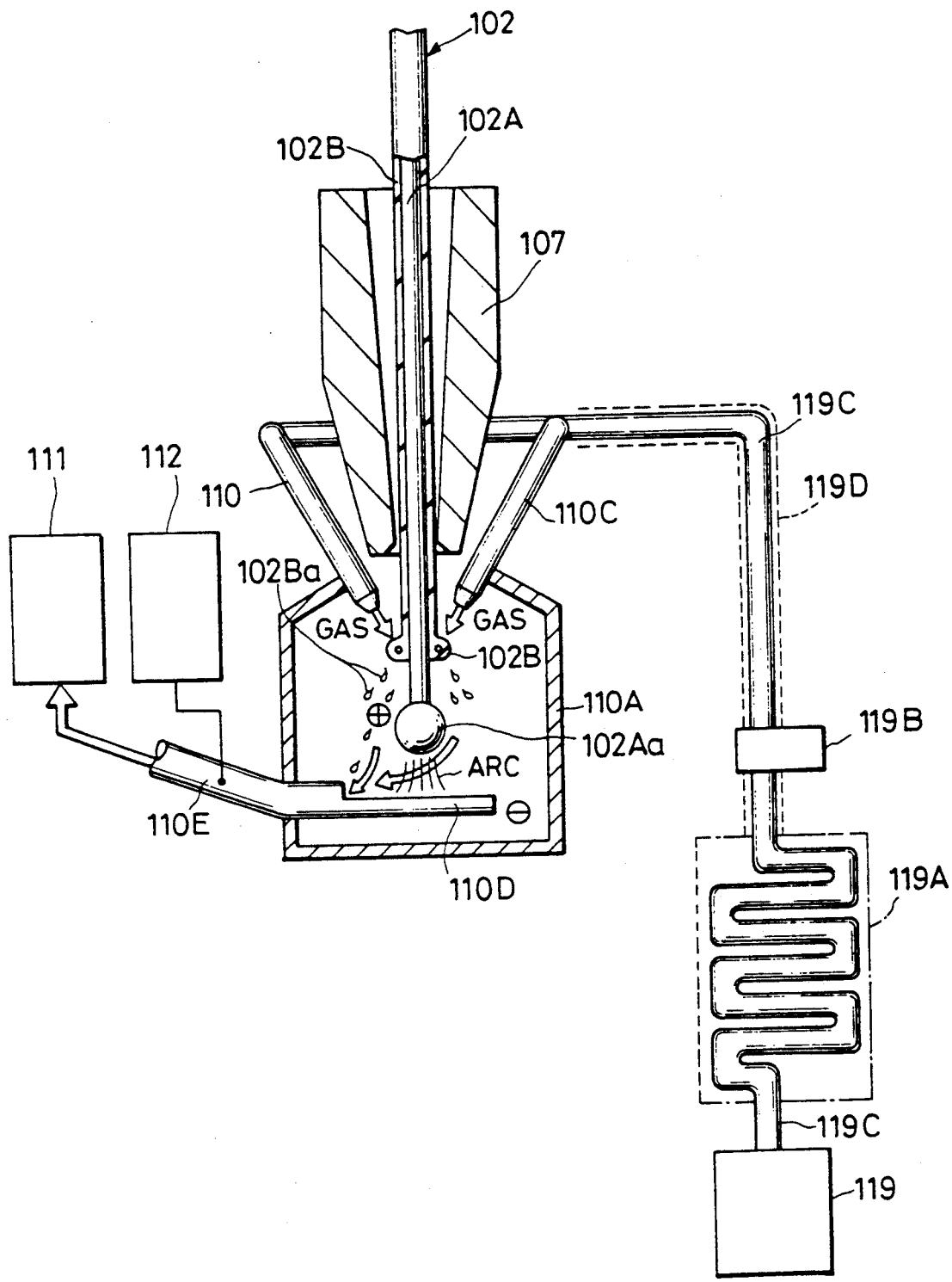
FIG. 20 is a model-like constructional view for explaining the principle of the formation of a metal ball.

An electric torch (arc electrode) 110D is disposed at the bottom part of the cover member 110A as shown in FIGS. 13, 14, 17 and 19. As illustrated in FIG. 20 (a model-like constructional view for elucidating the principle of forming the metal ball), the electric torch 110D is constructed so as to come near to the metal wire 102A at the supply-side front end of the coated wire 102 and to strike electric arcs across it and the metal wire, thereby to form the metal ball 102A$a$. This electric torch 110D is made of, for example, tungsten which endures high temperatures.

The electric torch 110D is connected to an arcing unit 112 through suction pipe 110E of a suction unit 111 which is made of a conductive material. The suction pipe 110E is made of, for example, stainless steel and has the electric torch 110D fastened thereto through a bonding metal layer of Ag-Cu brazing material or the like. This suction pipe 110E is fastened to the cover member 110A through a clamp member 110F. That is, the electric torch 110D as well as the suction pipe 110E and the cover member 110A are unitarily constructed.

The electric torch 110D can move in the direction of the arrow A indicated in FIG. 14 so as to come near to the supply-side front end of the coated wire 102 when the metal ball 102Aa is formed as stated before and to come away from the supply path of the coated wire 102 during the bonding process. A moving mechanism for moving the electric torch 110D is principally constructed of a support member 110G which supports the electric torch 110D through the suction pipe 110E as well as an insulating member 110H, a crank shaft 110I which turns the support member 110G in the direction of the arrow A, and a drive source 110K which rotates the crank shaft 110I. The rotation of the crank shaft 110I is executed by the movement of the shaft 110J of the drive source 110K in the direction of double-headed arrow B, the shaft 110J being coupled to the crank portion of the crank shaft 110I. The drive source 110K is constructed of, for example, an electric solenoid. Though not illustratively clarified, the crank shaft 110I is rotatably supported on a bonding apparatus proper. Incidentally, the movement of the electric torch 110D and that of the cover member 110A are substantially the same because both these constituents are unitarily constructed.

As shown in FIG. 14, the arcing unit 112 is principally constructed of a capacitor $C_1$, a storage capacitor $C_2$, an arcing thyristor D which is actuated by a trigger, and a resistor R. A d.c. power source DC is arranged so as to feed a voltage of negative polarity at, for example, approximately $-1000 - -3000$ V. The d.c. power source DC is connected to the electric torch 110D through the thyristor D, the resistor R, etc. A reference potential GND is, for example, the ground potential ($=0$ V). Letter V indicates a voltmeter, and letter A an ammeter. As will be described in detail later, the metal wire 102A of the coated wire 102 is connected to the reference potential GND at its end part wound around the spool 101. As a result, in the case of forming the metal ball 102Aa at the front end of the coated wire 102 by the use of the electric torch 110D, it is possible to set the electric torch 110D at a negative potential ($-$) and the metal wire 102A of the front end of the coated wire 102 in the supply direction thereof at a positive potential ($+$), as illustrated in FIGS. 13, 14 and 20.

In the bonding apparatus wherein, in this manner, the electric arcs are struck across the metal wire 102A at the front end of the coated wire 102 and the arc electrode 110D so as to form the metal ball 102Aa at the front end of the coated wire 102, the metal wire 102A of the coated wire 102 is connected to the positive potential ($+$), and the electric torch 110D is connected to the negative potential ($-$), whereby the position of the electric arcs struck across the metal wire 102A of the coated wire 102 and the electric torch 110D can be stabilized more than in case of a reversal in polarity, and hence the upward crawl of the electric arcs toward the rear end of the metal wire 102A of the coated wire 102 can be relieved. The relief of the upward crawl of the electric arcs can reduce the shrinkable melting of the insulator 102B of the coated wire 102 and prevent the appearance of insulator globes.

In the present invention, the metal wire 102A of the coated wire 102 may well be connected to a voltage higher or lower than the reference potential GND so as to have a plus potential with respect to the electric torch 110D.

Figure 21:
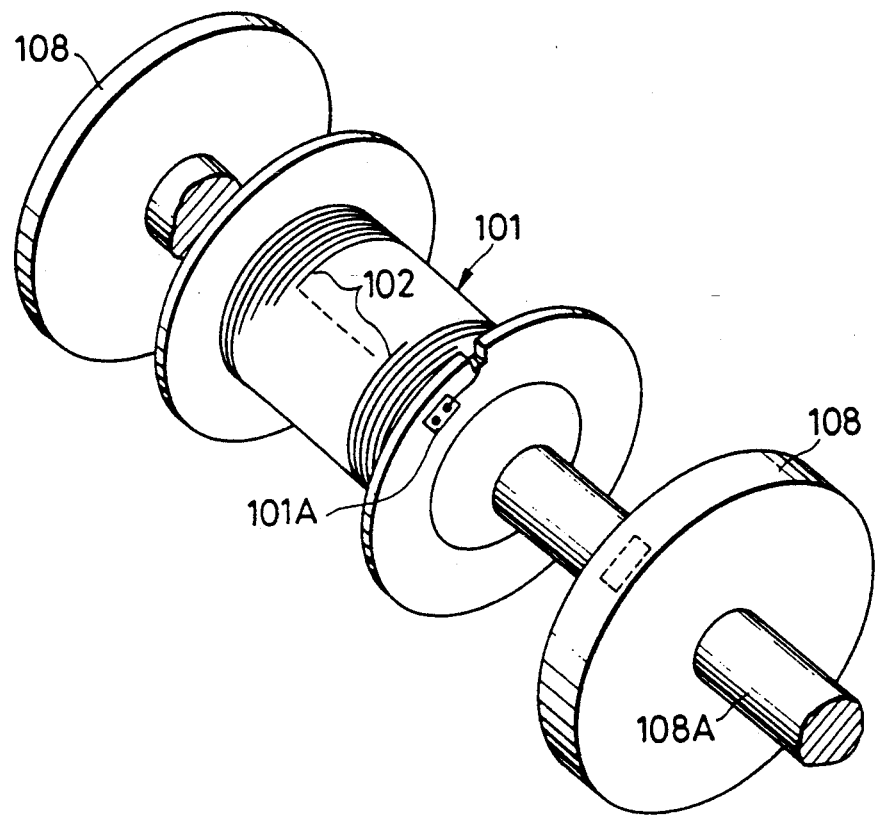
FIG. 21 is an exploded perspective view of specific portions of the spool of the ball-bonding apparatus.

The spool 101 around which the coated wire 102 is wound is constructed as illustrated in FIG. 14 and FIG. 21 (an exploded perspective view of specific portions). By way of example, the spool 101 is fabricated by subjecting the surface of a cylindrical member of aluminum metal to an alumite treatment. The alumite treatment is performed in order to raise the mechanical strength and to prevent flaws from developing. This spool 101 has an insulating property because it has been subjected to the alumite treatment as stated above.

The spool 101 is mounted on a spool holder 108, and is attached to the bonding apparatus proper 109 by the rotary shaft 108A of the spool holder 108.

The spool holder 108 is made of, for example, stainless steel in order to have a conductivity in at least a part thereof.

Figure 22:
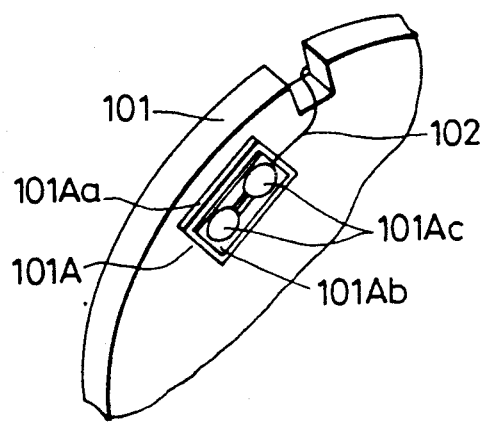
FIG. 22 is an enlarged perspective view of specific portions of the spool.

The spool 101 is provided with a connection terminal 101A as shown in FIG. 21 and FIG. 22 (an enlarged perspective view of specific portions). The connection terminal 101A is provided in the shape of a dot on that side face part (flange part) of the spool 101 which comes into contact with the conductive part of the spool holder 108.

As shown in FIG. 22, the connection terminal 101A is so configured that a conductor 101Ab is disposed on an insulator 101Aa and that connecting metal portions 101Ac are disposed on the conductor 101Ab. The insulator 101Aa is made of, for example, polyimide resin so as to exhibit a proper elasticity which ensures electrical isolation between the conductor 101Ab and the spool 101 and also ensures contact between the connecting metal portions 101Ac and the spool holder 108. The conductor 101Ab is formed of, for example, Cu foil so as to ensure connection between the connecting metal portion 101A which is connected to the metal wire 102A of the coated wire 102 and the connecting metal portion 101Ac which comes into contact with the spool holder 108 The connecting metal portions 101Ac are made of a conductive paste, a solder or the like.

The metal wire 102A at the end of the coated wire 102 on the opposite end to the end which is supplied to the bonding space 103, that is, the metal wire 102A at the initial winding end of the coated wire 102, is connected to the connection terminal 101A through a notch which is formed in the side face (flange part) of the spool 101. This metal wire 102A is joined to the connection terminal 101A by the connecting metal portion 101Ac. The insulator 102B on the surface of the metal wire 102A at the initial winding end of the coated wire 102 is removed chemically or by heating. The connection terminal 101A, namely, the metal wire 102A of the coated wire 102, is connected to the reference potential GND through the spool holder 108, the rotary shaft 108A thereof and the apparatus proper 109. This reference potential GND is the same as the reference potential GND of the arcing unit 112.

In this manner, the spool 101 is furnished with the connection terminal 101A for connecting the metal wire 102A to the reference potential GND, and the metal wire 102A at the initial winding end of the coated wire 102 is joined to this connection terminal, whereby the metal wire 102A can be connected to the reference potential GND through the spool holder 108, etc., so that the metal wire 102A of the coated wire 102 can be reliably connected to the reference potential GND.

Besides, owing to the connection of the metal wire 102A of the coated wire 102 to the reference potential GND, during the formation of the metal ball 102Aa, a sufficient potential difference is secured between the electric torch 110D and the metal wire 102A of the coated wire 102 on the supply side, and the electric arcs can be favorably struck, so that the metal ball 102Aa can be reliably formed.

As illustrated in FIGS. 13 and 14, the bonding tool 107 is carried by a bonding head (digital bonding head) 114 through a bonding arm 107A. Though not shown, an ultrasonic vibrator is built in the bonding arm 107A, and it is adapted to vibrate the bonding tool 107 ultrasonically. As the wire bonding system, accordingly, the thermocompression system and/or the ultrasonic vibration system can be adopted under the optimum conditions for the specifications of the coated wire and the device to be subjected to the wire bonding. The bonding head 114 is supported on a base 118 through an X-Y table 117. The bonding head 114 is furnished with a moving mechanism which can move the bonding arm 107A vertically (in the direction of double-headed arrow C) so as to permit the bonding tool 107 to come close to and away from the bonding space 103. This moving mechanism is principally constructed of a guide member 114A, an arm moving member 114B, a female screw member 114C, a male screw member 114D and a motor 114E. The guide member 114A is so configured as to move the arm moving member 114B in the direction of the arrow C. The motor 114E rotates the male screw member 114D, the female screw member 114C in fit engagement with the male screw member 114D is moved in the direction of the arrow C by the rotation, and the arm moving member 114B is shifted in the direction of the arrow C by the movement.

The bonding arm 107A supported by the arm moving member 114B is adapted to turn about a swivel shaft 114F. The turning of the bonding arm 107A about the swivel shaft 114F is controlled by an elastic member 114G. The control of the turning by the elastic member 114G is so provided that, when the bonding tool 107 has touched the bonding space 103, this bonding space 103 is prevented from being subjected to unnecessary pressure, whereby damage or breakdown of the bonding space 103 is avoided.

The wire clamper 106 can clamp the coated wire 102, and is constructed so as to control the supply of the coated wire 102. The wire clamper 106 is mounted on the bonding arm 107A through clamper arms 106A.

The wire guide member 105 is so constructed that the coated wire 102 supplied from the spool 101 is guided to the bonding space 103. This wire guide member 105 is mounted on the clamper arm 106A.

Near the front end of the coated wire 102 in the supply direction thereof and near the supply path of the coated wire 102, between the bonding tool 107 and the bonding space 103, the fluid blast nozzles 110C of a fluid blast equipment 119 are disposed as shown in FIGS. 13, 14, 17 and 20. The fluid blast nozzles 110C are so constructed that, when the metal ball 102Aa is formed of the metal wire 102A at the front end of the coated wire 102 in the supply direction thereof, a fluid or gas from the fluid blast equipment 119 is blasted against the area of the formation (the metal wire 102A and the insulator 102B). As illustrated in FIG. 20, the gas which is blasted from the fluid blast nozzles 110C is adapted to blow away (102Ba) the insulator 102B which is melted and raised or shrunk by heat generated by the electric arcs in the case where the metal ball 102Aa is formed of the metal wire 102A at the front end of the coated wire 102.

The fluid blast nozzles 110C may basically blast the gas against the front end part of the bonding tool 107, namely, the front end part of the coated wire 102 as stated above, and they are mounted on the cover member 110A in the present embodiment. As their concrete structure is shown in FIG. 14 and FIGS. 17 to 19, the fluid blast nozzles 110C are configured so as to blast the gas from the rear end toward the front end of the coated wire 102 for the purpose of diminishing the shrinkable melting of the insulator 102B. Incidentally, it is more preferable that the fluid blast nozzles 110C are not mounted on the bonding tool 107. In a case where the fluid blast nozzles 110C are mounted on the bonding tool 107, the weight of the bonding tool 107 increases to heighten the load of the ultrasonic vibrations thereof, and hence, the bondability of the joint part degrades.

A gas such as $N_2$, $H_2$, He, Ar or air is used as the fluid. As illustrated in FIG. 20, it is supplied from the fluid blast equipment (fluid source) 119 to the fluid blast nozzles 110C through a cooler 119A, a flowmeter 119B and a fluid conveyance pipe 119C.

The cooler 119A is configured so as to positively cool the gas below room temperature. By way of example, it is constructed of an electronic cooler which utilizes the Peltier effect. Though illustrated in simplified fashion in FIG. 20, the fluid conveyance pipe 119C is so constructed that at least its section between the cooler 119A and a supply port for the fluid blast nozzles 110C is covered with a thermal insulator 119D. That is, the thermal insulator 119D is arranged in order that the temperature of the gas cooled by the cooler 119A does not change during the conveyance of the gas through the fluid conveyance pipe 119C (that the cooling efficiency may be heightened).

As an alternative example of the cooler, a product "COLDER" manufactured by SANWA ENTERPRISES Co., Ltd. may be used. This product "COLDER" is a device which generates air of a very low temperature on the basis of the principle of a vortex, and with which the temperature of the cold air and the rate of discharge of the cold air can be regulated by simple operations. This device "COLDER" can generate very cold air, at −50° C., merely by connecting compressed air at an incoming air temperature of +15° C. under an incoming air pressure of 7 kg/cm$^2$. It is compact, and is smaller in size than the electronic cooler utilizing the Peltier effect.

Besides, when the device "COLDER" is employed together with the cooler utilizing the Peltier effect, there is the effect that the whole cooler as described above can be made smaller in size and lighter in weight.

Meanwhile, the suction pipe 110E coupled to the suction unit 111 is disposed at the position which is close to the front end of the coated wire 102 in the supply direction thereof and which opposes to the fluid blast nozzles 110C with the melted and shrunk part of the insulator 102B of the coated wire 102 intervening therebetween. Although this suction pipe 110E is used as the electric conductor for connecting the electric torch 110D and the arcing unit 112 as stated before, it is principally intended to suck up the melted and shrunk insulator 102Ba of the coated wire 102 blown away by the blast nozzles 110C. The insulator 102Ba sucked up by the suction pipe 110E is drawn by the suction unit 111.

Next, the ball-bonding method of the present embodiment will be briefly explained.

First, as illustrated in FIGS. 13, 14, 17 and 20, the bonding tool 107 and the front end part of the coated wire 102 in the supply direction thereof, that protrudes on the side of the pressing face of the bonding tool, are concealed by the cover member 110A. The concealment is attained in such a way that the cover member 110A is moved in the direction of the arrow A by the moving mechanism which is actuated by the drive source 110K. Besides, the concealment by the cover member 110A can provide both the electric torch 110D and the fluid blast nozzles 110C near the front end of the coated wire 102.

Secondly, as illustrated in FIG. 20, the electric arcs are struck across the electric torch 110D and the metal wire 102A at the front end of the coated wire 102 in the supply direction thereof so as to form the metal ball 102Aa out of the metal wire 102A. The heat of the electric arcs for forming the metal ball 102Aa melts and raises or shrinks the insulator 102B at the front end of the coated wire 102 in the supply direction thereof. That is, the insulator 102B at the front end of the coated wire 102 in the supply direction thereof is removed to denude the metal wire 102A.

Figure 23:
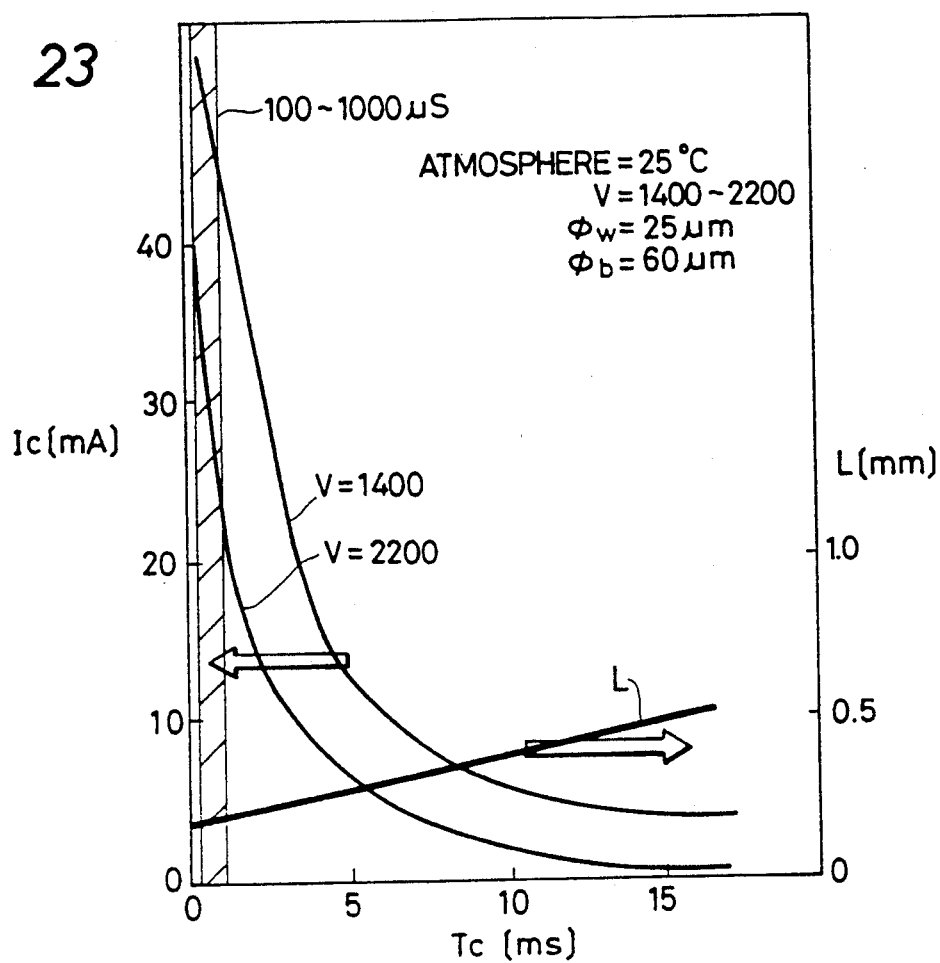
FIG. 23 is a graph showing the relationship between the magnitude of energy of electric arcs and the magnitude of shrinkable melting of the insulator of a coated wire.

The metal ball 102Aa is formed in a short time as illustrated in FIG. 23 (a graph of the relationship between the magnitude of energy of the electric arcs and the magnitude of shrinkable melting of the insulator). In this figure, the axis of abscissas represents the electric discharge time $T_c$ [ms] of the electric arcs, while the axes of ordinates represent the magnitude of current $I_c$ [mA] and the magnitude of shrinkable melting L [mm] of the insulator 102B of the coated wire 102. Data mentioned in FIG. 23 indicates the magnitude of shrinkable melting L [mm] of the insulator (polyurethane resin) 102B required for forming the metal ball 102Aa of the coated wire 102 into a diameter $\phi_b$ of 60 μm in a case where the ambient temperature is the normal temperature of 25° C., where the diameter $\phi_w$ of the metal wire (Au) 102A of the coated wire 102 is 25 μm and where the voltage V is 1400 V or 2200 V. As illustrated in the graph, when the metal ball 102Aa is formed in a shorter time and at higher energy (in a region in which both the current and the voltage are higher), the magnitude of shrinkable melting of the insulator 102B of the coated wire 102 decreases more (as indicated by a thick solid line). As the result of a fundamental experiment by the inventors, in a highly-packaged resin-encapsulated semiconductor device 120 in which the number of leads 102D, i.e., the number of pins, was about 100, the metal ball 102Aa could be formed in a short time of 100–1000 μs, and the magnitude of shrinkable melting L of the insulator 102B of the coated wire 102 could be suppressed within a range of small values of 0.2–0.4 mm. The magnitude of shrinkable melting L of the insulator is stipulated by the requisites that the coated wire does not continue to the adjacent wire due to the melted and shrunk part of the coating, and that the outer part of the semiconductor pellet does not touch or does not fall into a continuous state due to the melted and shrunk part of the coating. Forming the metal ball 102Aa in a shorter time and at a higher energy in this manner can be realized by stabilizing the generation of the electric arcs as described before, namely, by setting the electric torch 110D at a minus potential (−) and the metal wire 102A of the coated wire 102 at a plus potential (+).

In addition, in forming the metal ball 102Aa, the gas from the fluid blast equipment 119 is blasted against the melting and shrinking insulator 102B of the coated wire 102 by the fluid blast nozzles 110C which have been positioned together with the cover member 110A, whereby the insulator 102B is blown away as illustrated in FIG. 20. The insulator 102Ba blown away is drawn by the suction unit 111 through the suction pipe 110.

Figure 24:
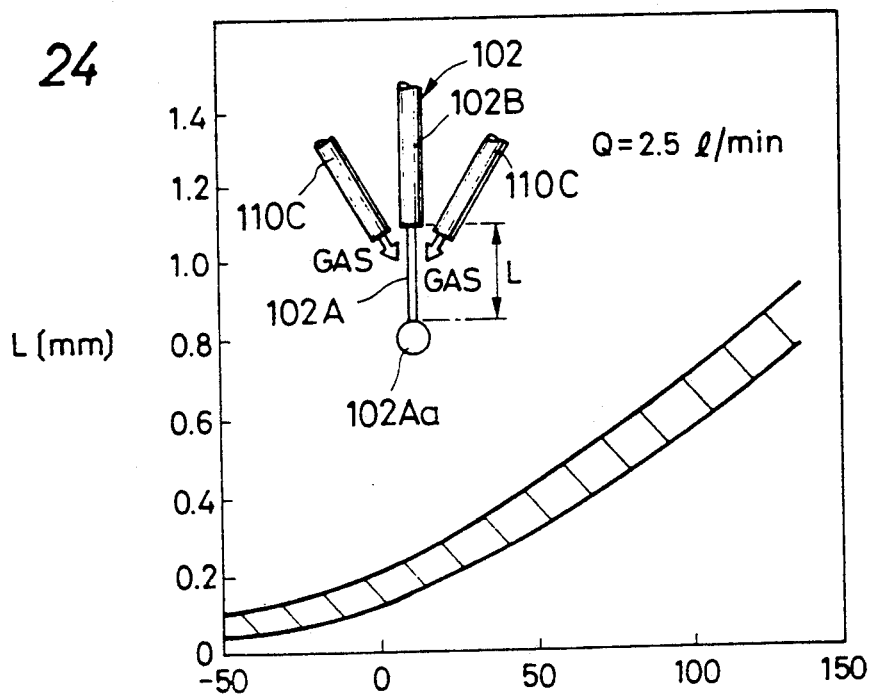
FIG. 24 is a graph showing the relationship between the temperature of a fluid and the magnitude of shrinkable melting of the insulator of the coated wire.

The gas from the fluid blast nozzles 110C has been cooled down to approximately 0°–10° C. by the cooler 119A shown in FIG. 20. FIG. 24 illustrated the relationship between the temperature $T_g$ [° C.] of the gas (the axis of abscissas) and the magnitude of shrinkable melting L [mm] of the insulator 102B of the coated wire 102 (the axis or ordinates). The flow rate Q of the gas from the fluid blast nozzles 110C is 0.5–2.5 lit./min. As shown in the figures, as the temperature of the gas from the fluid blast nozzles 110C is lower, the magnitude of shrinkable melting L of the insulator 102B of the coated wire 102 is smaller. That is, since the gas cooled by the cooler 119A can positively cool the metal wire 102A and insulator 102B of the coated wire 102, the bonding tool 107, etc., the insulator 102B in only the area where the electric arcs appear can be melted to lessen the magnitude of shrinkable melting of the insulator 102B.

Subsequently, the cover member 110A is moved in the direction of the arrow A (in the opposite sense to the foregoing) together with both the electric torch 110D and the fluid blast nozzles 110C.

Subsequently, the metal ball 102Aa formed at the front end of the coated wire 102 in the supply direction thereof is drawn toward the pressing face of the bonding tool 107.

Next, under this state, the bonding tool 107 is brought near to the bonding space 103, and as the bonding tool 107 is indicated by phantom lines in FIG. 16, the metal ball 102Aa formed at the front end of the coated wire 102 in the supply direction thereof is joined to the external terminal 102Aa of the semiconductor chip 120A (first bonding). The joining of the metal ball 102Aa is effected by ultrasonic vibration and thermocompression (or either of them) of the bonding tool 7.

At the next step, as shown in FIG. 16, the metal wire 102A at the rear end of the coated wire 102 is joined to the lead 102D by the bonding tool 107 (second bonding). The joining of the rear end of the coated wire 102 is effected by ultrasonic vibration and thermocompression (or only the former of them) of the bonding tool 107. As regards the joining of the rear end of the coated wire 102, the joint part of the coated wire 102 is coated with the insulator 102B beforehand. By the ultrasonic vibration of the bonding tool 107, however, the insulator 102B in only the joint part is destroyed to denude the metal wire 102A. The insulator (in the case of polyurethane resin) 102B of the coated wire 102 should preferably have a film thickness of about 0.2–3 μm, though the thickness value somewhat changes depending upon the energy of the ultrasonic vibration or the force of the thermocompression of the bonding tool 107. In particular, the optimum thickness of the film of the insulator 102B is about 0.2–1.0 μm. In a case where the thickness of the insulator 102B of the coated wire 102 is less than 0.2 μm, the withstand voltage of the insulator 102B is low. In addition, in a case where the thickness of the insulator 102B of the coated wire 102 is greater than 1.0 μm, it becomes difficult to destroy the insulator 102B by ultrasonic vibration of the bonding tool 107, and in a case where the thickness of the insulator 102B is greater than 3.0 μm, the insulator 102B is not destroyed. Therefore, the joining between the metal wire 102A of the coated wire 102 and the lead 102D becomes defective.

Subsequently, the bonding tool 107 is brought away (on this occasion, the coated wire 102 is cut, as done conventionally), whereby the bonding process is completed as shown in FIG. 16.

In this manner, in the bonding technology wherein the metal ball 102Aa is formed at the front end of the coated wire 102, the fluid blast nozzles 110C (part of the fluid blast equipment 119) for blasting the gas against the front end part of the coated wire 102 are disposed near the front end of the coated wire 102, whereby the melting and shrinking insulator 102B of the coated wire 102 can be blown away, so that the coated wire 102 can be prevented from being formed with the insulator globes. As a result, catching of the coated wire 102 in the bonding tool 107, attributed to the insulator globes, is prevented, and the coated wire 102 can be drawn to the pressing face of the bonding tool 107, so that the ball bonding can be performed and a bonding defect is avoidable.

Besides, in the bonding technology wherein the metal ball 102Aa is formed at the front end of the coated wire 102, the fluid blast nozzles 110C (the fluid blast equipment 119) stated above is disposed, and the suction pipe 110E (the suction unit 111) which draws the insulator 102B of the coated wire 102 blown away by the blast of the gas from the fluid blast nozzles 110C is disposed, near the front end of the coated wire 102, whereby the melting and shrinking insulator 102B of the coated wire 102 can be blown away to prevent the formation of the insulator globes in the coated wire 102 and to avoid the bonding defect as described above; and, moreover, the insulator 102Ba blown away is prevented from scattering to the bonding space 103, so that a bonding defect attributed to the scattered insulator 102B is avoidable. The bonding defect attributed to the scattered insulator 102Ba signifies, for example, a case where the insulator 102Ba scatters to the position of the connection between the external terminal 120Aa of the semiconductor chip 120A or the lead 120D and the metal wire 102A of the coated wire 102, so the continuity between the two becomes inferior.

Further, in the bonding technology wherein the metal ball 102Aa is formed at the front end of the coated wire 102, the fluid blast nozzles 110C (the fluid blast equipment 119) stated above are disposed, and the cooler 119A for cooling the gas of the fluid blast nozzles 110C is disposed whereby the shrinkable melting of the insulator 102B of the coated wire 102 is remarkably reduced, and even when the insulator 102B has melted and shrunk it can be blown away, so that the formation of insulator globes in the coated wire 102 is prevented, and the bonding defect is avoidable as described before.

Further, in the bonding technology which uses the coated wire 102, the metal ball 102Aa is formed at the front end of the coated wire 102 in the supply direction thereof, and it is joined to the external terminal 120Aa of the semiconductor chip 120A. A rear end of the coated wire 102 in the supply direction thereof is brought into contact with the lead 120D, the insulator 102B at the contact part is destroyed, and the metal wire 102A on the other end of the coated wire 102 is joined to the lead 120D, whereby the insulator 102B can be removed without using an insulator removal torch which removes the insulator 102B on the rear end of the coated wire 102; accordingly, the insulator removal torch, and moving mechanisms and controllers therefor, can be dispensed with. As a result, the structure of the bonding apparatus can be simplified.

Embodiment 6

Embodiment 6 is another embodiment of the present invention in which the construction of the fluid blast equipment of the ball-bonding apparatus is altered.

Figure 26:
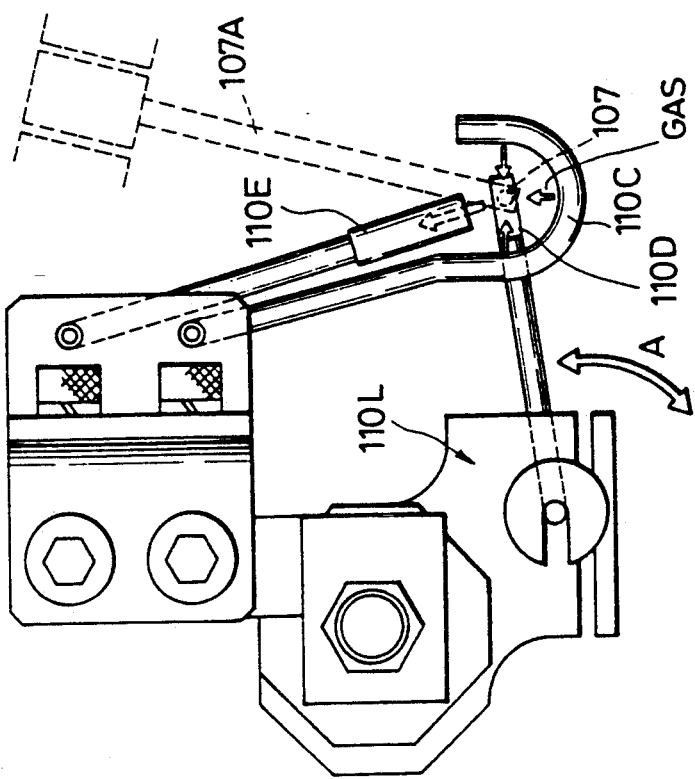
FIG. 26 is a plan view taken in the direction of arrow XXVI in FIG. 25.
Figure 25:
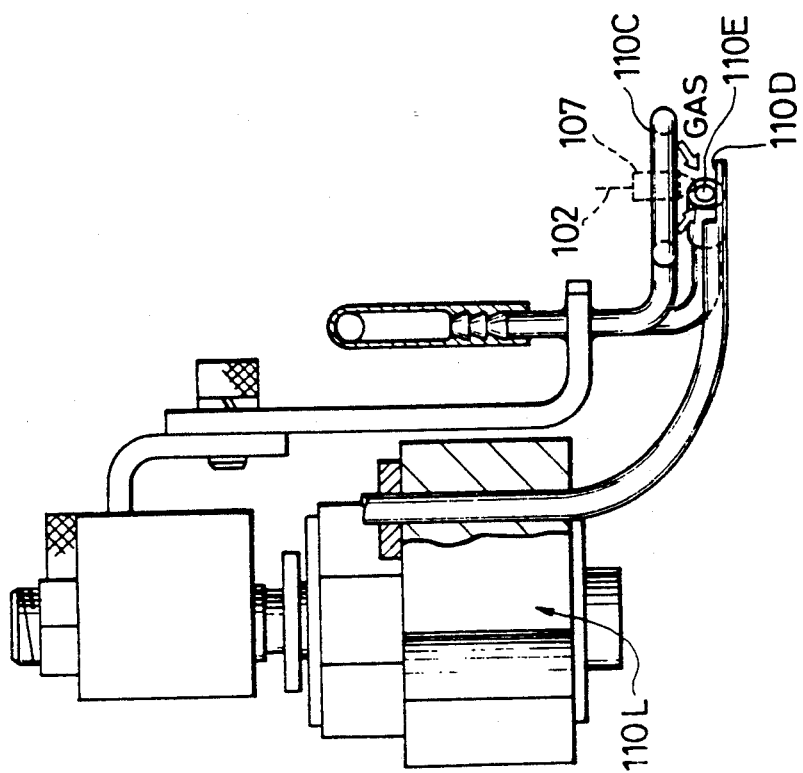
FIG. 25 is a partial sectional view showing specific portions of a ball-bonding apparatus which is Embodiment 6 of the present invention.

Important portions of the ball-bonding apparatus which is Embodiment 6 of the present invention are shown in FIG. 25 (a partial sectional view) and FIG. 26 (a plan view seen in the direction of arrow XIV in FIG. 25).

As illustrated in FIGS. 25 and 26, the fluid blast nozzle 110C of the fluid blast equipment 119 (not shown) in the present Embodiment 6 is so configured that a U-shaped fluid conveyance pipe is provided with pores for blasting the gas. This fluid blast nozzle 110C in the shape of letter U is fastened to the bonding apparatus proper, for example, the X-Y table 117.

The suction pipe 110E of the suction unit 11 (not shown) is oriented in the direction in which the gas from the U-shaped fluid blast nozzle 110C is blasted. Similarly to the fluid blast nozzle 110C, the suction pipe 110E is fastened to the bonding apparatus proper, for example, the X-Y table 117.

The electric torch 110D is constructed so at to move and turn in the direction of arrow A substantially in the same manner as in Embodiment 5. That is, the electric torch 110D is adapted to move to a position where the gas is blasted from the fluid blast nozzle 110C, when the metal ball 102Aa is formed at the front end of the coated wire 102 in the supply direction thereof, and to thereafter come away from the position when the bonding ball 102Aa is bonded. The movement of the electric torch 110D is effected by a moving mechanism 110L which is fastened to the bonding apparatus proper, for example, the X-Y table 117.

The fluid blast nozzle 110C, the suction pipe 110E and the electric torch 110D are directly fastened to the bonding apparatus proper because the cover member 110A disposed in Embodiment 5 is not included.

With the ball-bonding apparatus thus constructed, when the metal ball 102Aa is formed at the front end of the coated wire 102 in the supply direction thereof, an operator can observe the front end part. It is therefore possible to optimize the state of generation of the electric arcs, the state of blast of the gas from the fluid blast nozzle 110C, the state of suction of the insulator 102B scattered by the gas, and so on.

Although, in the above, the invention made by the inventors has been concretely described in conjunction with embodiments thereof, it is a matter of course that the present invention is not restricted to the foregoing embodiments, but that it can be variously modified without departing from the purport thereof.

By way of example, the present invention is not restricted to the resin-encapsulated semiconductor device, but it is applicable to the semiconductor technology of a ceramic-encapsulated semiconductor device.

While we have shown and described several embodiments in accordance with the present invention, it is understood that the same is not limited thereto but is susceptible of numerous changes and modifications as known to one having ordinary skill in the art and we therefore do not wish to be limited to the details shown and described herein, but intend to cover all such modifications as are encompassed by the scope of the appended claims.

What is claimed is:

1. A method for fabricating a semiconductor device, comprising the steps of:
    (a) providing an insulating film coated metal bonding wire having a first end and a second end, the first end to be bonded to a bonding pad on a semiconductor device chip;
    (b) bonding the first end to the bonding pad on the semiconductor device chip;
    (c) removing the insulating film of the insulating film coated metal bonding wire, by heat, at a predetermined point between the first end and the second end of the bonding wire, while evacuating vapor of the insulating film produced by the heat through an evacuating nozzle adjacent to the predetermined point of the wire; and
    (d) bonding the wire, at the predetermined point where the insulating film has been removed, to a lead.

2. A method according to claim 1, wherein said bonding the wire to the lead is performed by wedge-bonding.

3. A method according to claim 1, wherein said removing the insulating film at the predetermined point is performed after bonding the first end to the bonding pad.

4. A method according to claim 1, wherein said bonding the first end to the bonding pad includes removing the insulating film from the first end by heating, and wherein a vapor of the insulating film, produced by the heating to remove the insulating film from the first end, is evacuated through an evacuating nozzle adjacent the first end of the bonding wire.

5. A method according to claim 4, wherein said insulting film is an organic resin insulating film.

6. A method according to claim 1, wherein said insulating film is an organic resin insulating film.

7. A method for fabricating a semiconductor device, comprising the steps of:
    (a) placing a semiconductor device chip, having at least one bonding pad on an upper major surface thereof, and at least lead outside the chip, onto a wire bonding stage of a wire bonder;
    (b) providing a bonding capillary, through a bore thereof, with an insulating film coated metal bonding wire coiled on a spool so that a first end of the wire projects from a lower tip of the capillary through the bore, the wire having a second end;
    (c) bonding the first end of the bonding wire to the bonding pad;
    (d) after step (c), removing the insulating film of the wire, by heat, at a predetermined point between the first end and the second end of the wire, while evacuating vapor of the insulating film, produced by the heat, through an evacuating nozzle adjacent to the predetermined point of the wire; and
    (e) bonding the wire to the lead at the predetermined point between the first end and the second end of the wire where the insulating film has been removed.

8. A method according to claim 7, wherein said bonding the wire to the lead is performed by wedge-bonding.

9. A method according to claim 7, wherein said bonding the wire to the bonding pad includes removing the insulating film from the first end by heating, and wherein a vapor of the insulating film produced by the heating in removing the insulating film from the first end is evacuated through an evacuating nozzle adjacent the first end of the bonding wire.

10. A method according to claim 9, wherein said insulating film is an organic resin insulating film.

11. A method according to claim 7, wherein said insulating film is an organic resin insulating film.

12. A method according to claim 7, wherein the bonding the wire to the bonding pad includes forming a ball on the first end of the wire, and pressing the ball against the bonding pad.

13. A method according to claim 12, wherein the ball is pressed against the bonding pad by the lower tip of the capillary.

14. A method for fabricating a semiconductor device, comprising the steps of:
    (a) placing a semiconductor device chip, having at least one bonding pad on an upper major surface thereof, and at least one lead outside the chip, onto a wire bonding stage of a wire bonder;
    (b) providing a bonding capillary, through a bore thereof, with an insulating film coated metal bonding wire coiled on a spool so that a first end of the wire projects from a lower tip of the capillary through the bore, the wire having a second end;
    (c) generating an arc discharge through a gap between the first end of the wire, projected from the lower tip of the capillary, and an opposed discharge electrode, thereby forming a ball on the first end of the wire;
    (d) bonding the wire to the bonding pad by pressing the ball against the pad with the lower tip of the capillary;
    (e) after step (d), removing the insulating film of the wire by heat at a predetermined point between the first end and the second end of the wire, while evacuating a vapor of the insulating film, produced by the heat, through an evacuating nozzle adjacent to the predetermined point of the wire; and
    (f) wedge-bonding the wire to the lead at the predetermined point between the first and the second ends of the wire where the insulating film has been removed.

15. A method according to claim 14, wherein said bonding the wire to the bonding pad includes removing the insulating film from the first end by heating, and wherein a vapor of the insulating film, produced by the heating in removing the insulating film from the first end, is evacuated through an evacuating nozzle adjacent the first end of the bonding wire.

16. A method according to claim 15, wherein said insulating film is an organic resin insulating film.

17. A method according to claim 14, wherein said insulating film is an organic resin insulating film.

18. A method for fabricating a semiconductor device, comprising the steps of:
    (a) placing a semiconductor device chip, having at least one bonding pad on an upper major surface thereof, and at least one lead outside the chip, onto a wire bonding stage of a wire bonder;
    (b) providing a bonding capillary, through a bore thereof, with an insulating film coated metal bonding wire coiled on a spool so that a first end of the wire projects from a lower tip of the capillary through the bore, the wire having a second end;
    (c) generating an arc discharge through a gap between the first end of the wire, projected from the lower tip of the capillary, and an opposed discharge electrode, by applying a first electric potential to the first end of the wire through the second end of the wire adjacent to the spool and applying a second electric potential to the electrode, thereby forming a ball on the first end of the wire, while the second end of the wire is connected to a common ground electric potential of the bonder so as to prevent an undesirable discharge between the wire and the bonder from taking place directly therebetween or through the chip;

(d) bonding the wire to the bonding pad by pressing the ball against the pad with the lower tip of the capillary, while the second end of the wire is connected to the common ground electric potential of the bonder;

(e) after step (d), removing the insulating film of the wire, by heat, at a predetermined point between the first end and the second end of the wire, while evacuating a vapor of the insulating film, produced by the heat, through an evacuating nozzle adjacent to the predetermined point of the wire; and (f) wedge-bonding the wire to the lead at the predetermined point between the first end and the second end of the wire where the insulating film has been removed.

19. A method according to claim 18, wherein the wire has been coated over substantially a full length thereof with a sufficiently thin film of an organic resin as the insulating film such that the insulating film at the first end of the wire can be removed by heat generation during the arc discharge.

20. A method according to claim 19, wherein said generating an arc discharge is performed while evacuating vapor of the organic resin, produced by the heat of the arc discharge, through an evacuating nozzle adjacent to the first end of the wire.

21. A method according to claim 19, wherein the first electric potential is positive relative to the second electric potential.

22. A method according to claim 21, wherein the metal wire is made of gold.

23. A method according to claim 22, wherein the insulating film is made of a polyurethane resin.

24. A method according to claim 22, wherein the insulating film is made of a polyimide resin.

25. A method according to claim 22, wherein the common ground is electrically common to that of an arc generator for generating the first and second potential.

26. A method for fabricating a semiconductor device, comprising the steps of:

(a) placing a semiconductor device chip, having at least one bonding pad on an upper major surface thereof, and at least one lead outside the chip, onto a wire bonding stage of a wire bonder;

(b) providing a bonding capillary, through a bore thereof, with an organic insulating film coated metal bonding wire coiled on a spool so that a first end of the wire projects from a lower tip of the capillary through the bore, the wire having a second end;

(c) generating an arc discharge through a gap between the first end of the wire, projected from the lower tip of the capillary, and an opposed discharge electrode, by applying a first electric potential to the first end of the wire through the second end of the wire adjacent to the spool and applying a second electric potential to the electrode, thereby forming a ball on the first end of the wire, the first electric potential being positive relative to the second electric potential so as to concentrate the heating effect of the arc discharge on the first end of the wire;

(d) bonding the wire to the bonding pad by pressing the ball against the pad with the lower tip of the capillary;

(e) after step (d), removing the insulating film of the wire, by heat, at a predetermined point between the first end and the second end of the wire, while evacuating vapor of the insulating film produced by the heat through an evacuating nozzle adjacent to the predetermined point of the wire; and (f) wedge-bonding the wire to the lead at the predetermined point between the first end and the second end of the wire where the insulating film has been removed.

27. A method according to claim 26, wherein the wire has been coated over substantially a full length thereof with a sufficiently thin film of an organic resin as the insulating film such that the insulating film at the first end of the wire can be removed by heat generation during the arc discharge.

28. A method according to claim 27, wherein said generating the arc discharge is performed while evacuating vapor of the organic resin, produced by the heat of the arc discharge, through an evacuating nozzle adjacent to the first end of the wire.

29. A method according to claim 27, wherein steps from (c) to (e) are performed while the second end of the wire is connected to a common ground electric potential of the bonder so as to prevent an undesirable discharge between the wire and the bonder from taking place directly therebetween or through the chip.

30. A method according to claim 29, wherein the common ground is electrically common to that of an arc generator for generating the first and second potential.

31. A method according to claim 29, wherein the metal wire is made of gold.

32. A method according to claim 31, wherein the insulating film is made of a polyurethane resin.

* * * * *